(12) United States Patent
Starr et al.

(10) Patent No.: US 8,650,429 B1
(45) Date of Patent: Feb. 11, 2014

(54) CLOCK PHASE ALIGNMENT

(75) Inventors: Greg W. Starr, San Jose, CA (US); Xiang Zhu, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 649 days.

(21) Appl. No.: 12/695,786

(22) Filed: Jan. 28, 2010

Related U.S. Application Data

(60) Provisional application No. 61/148,923, filed on Jan. 31, 2009, provisional application No. 61/148,930, filed on Jan. 31, 2009.

(51) Int. Cl.
*G06F 1/12* (2006.01)

(52) U.S. Cl.
USPC .......................................... 713/400

(58) Field of Classification Search
USPC .......................................... 713/400
See application file for complete search history.

(56) References Cited

U.S. PATENT DOCUMENTS

| | | | |
|---|---|---|---|
| 5,052,028 A * | 9/1991 | Zwack | 375/358 |
| 6,704,384 B1 * | 3/2004 | Suzuki | 375/377 |
| 7,346,794 B1 * | 3/2008 | Davidson et al. | 713/400 |

OTHER PUBLICATIONS

Alexander, J.D.H., "Clock Recovery From Random Binary Signals", Electronics Letters, vol. 11, Oct. 1975, pp. 541-542, Institution of Electrical Engineers.

* cited by examiner

*Primary Examiner* — Kim Huynh
*Assistant Examiner* — Eric Chang
(74) *Attorney, Agent, or Firm* — W. Eric Webostad; Gerald Chan

(57) ABSTRACT

A method and apparatus for clock phase alignment are described. An external clock is aligned to an internal clock by adjusting phase of the external clock. The external clock is of a physical medium attachment clock domain, and the internal clock is of a physical coding clock domain. After the aligning of the external clock to the internal clock, the external clock is maintained. The internal clock is aligned to the external clock by adjusting phase of the internal clock.

20 Claims, 15 Drawing Sheets

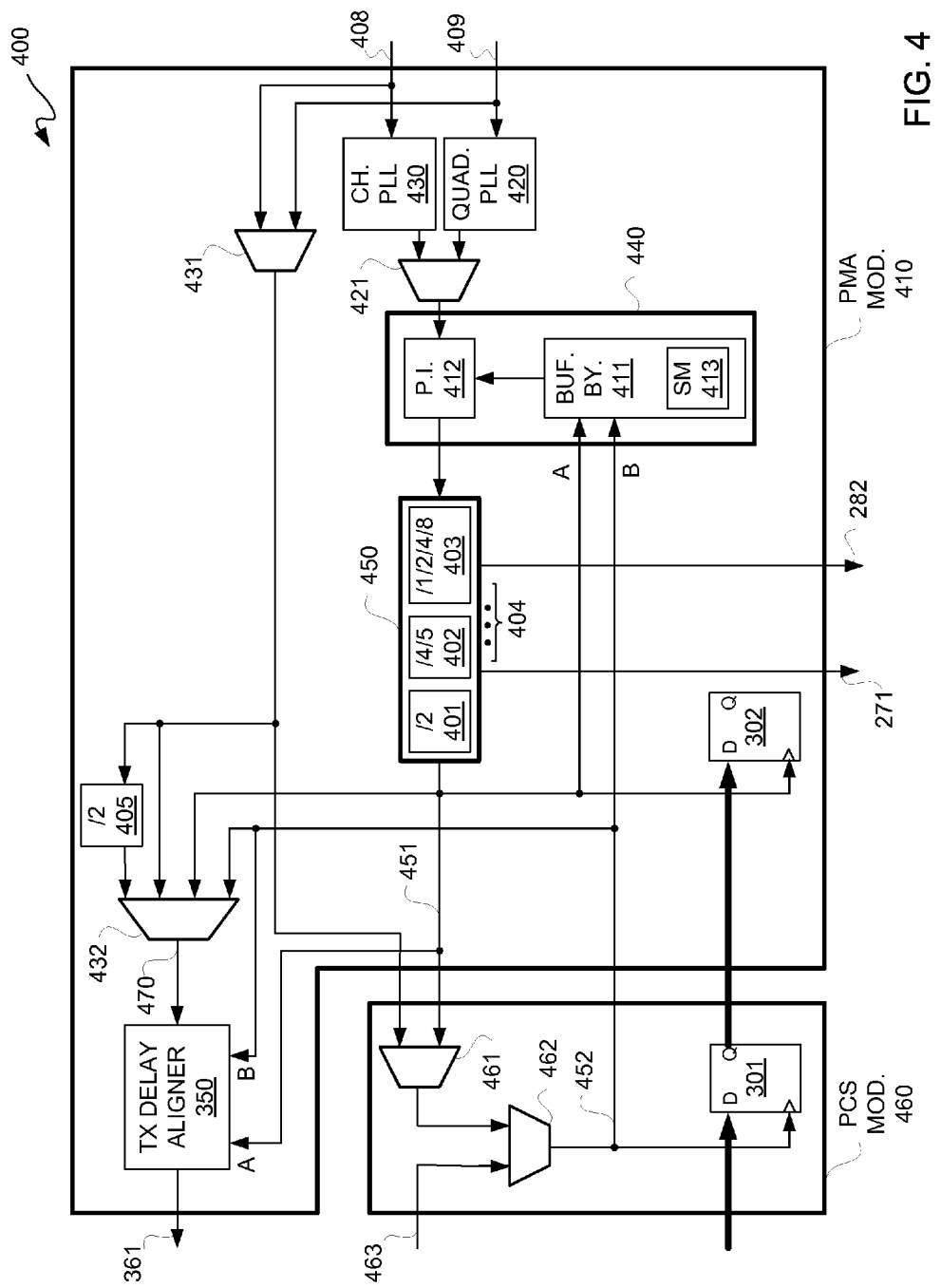

| ck_pre 1031 | ck_edge 1032 | ck_cur 1033 | early 1021E | late 1021L | |
|---|---|---|---|---|---|
| 0 | 0 | 0 | 0 | 0 | |
| 0 | 0 | 1 | 1 | 0 | |
| 0 | 1 | 0 | 1 | 0 | |
| 0 | 1 | 1 | 0 | 1 | ← 1101 |
| 1 | 0 | 0 | 0 | 1 | |
| 1 | 0 | 1 | 1 | 0 | |
| 1 | 1 | 0 | 1 | 0 | ← 1102 |
| 1 | 1 | 1 | 0 | 0 | |

CLOCK PHASE ALIGNMENT

CROSS-REFERENCE TO RELATED APPLICATIONS

This application claims benefit of U.S. Provisional Patent Application having the Application No. 61/148,923 filed on Jan. 31, 2009 and entitled "Multi-Gigabit Transceiver"; and also U.S. Provisional Patent Application having the Application No. 61/148,930 filed on Jan. 31, 2009 and entitled "Architecture for Advanced Integrated Circuit Providing High Performance." Both of these provisional patent applications are incorporated herein by reference in their entirety.

FIELD OF THE INVENTION

An embodiment of the invention relates to integrated circuit devices ("ICs"). More particularly, an embodiment of the invention relates to clock phase alignment in an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Performance of a design instantiated in programmable logic and routing of an FPGA ("FPGA fabric") may have delay or latency. However, such delay may vary with variations in semiconductor processing corners, power supply voltage, or operating temperature, or some combination thereof. These variables of process, voltage, and/or temperature are generally known as "PVT" variation. PVT variation may affect the timing relationship of a data link interface, including either or both a transmit side of a data link interface and a receive side of the data link interface.

As is known, configuration bits may be used to configure FPGA fabric routing and FPGA programmable logic fabric with FPGA fabric routing, where signal propagation delay is generally known within specified bounds. However, with respect to a SERDES application, a generally well-controlled data exchange interface is desirable, and delay variations due to PVT variation may cause phase noise. It should be understood that for a SERDES application, a transmit clock signal is a high speed clock signal for serial communication of data. Because of PVT variation, after an initial phase alignment between transmit and destination clock signals, a transmit clock signal often has to be readjusted in a conventional SERDES application, and such phase adjustments appear as phase noise or jitter.

While some SERDES applications generally have a fixed, namely varied within a small defined range, and controlled timing relationship for a data link interface, there may still be phase noise or jitter due to synchronizing to a received clock signal, whether provided as a separate clock signal or embedded within data. For purposes of clarity and not limitation, it shall be assumed that a clock is embedded in data, and thus recovered therefrom.

With respect to a receiver path having data and clock signaling following from an incoming data stream, output data from a physical-attachment layer clock domain thus may only get referenced to an embedded clock in such data stream but not any other stable reference clock. While the most closely aligned phase of a set of phases of a recovered clock may be aligned with respect to a physical-coding layer clock domain as an output clock to send data out of the physical-attachment layer clock domain, this initial alignment may be insufficient to support subsequent operation. In other words, such initial alignment may be insufficient due to changes caused by PVT variation and/or incoming data causing phase variations. By phase variations, it is generally meant the relationship between a selected phase of a recovered clock and a clock used in a physical-coding layer clock domain.

Accordingly, it would be desirable and useful to provide means to overcome one or more of the above identified limitations.

SUMMARY OF THE INVENTION

One or more embodiments generally relate to clock phase alignment.

An embodiment relates generally to a method for clock phase alignment. In such an embodiment, the method for clock phase alignment includes aligning an external clock to an internal clock by adjusting phase of the external clock, where the external clock is of a physical medium attachment clock domain, and where the internal clock is of a physical coding clock domain. After the aligning of the external clock to the internal clock, the external clock is maintained, and the internal clock is aligned to the external clock by adjusting phase of the internal clock.

Another embodiment relates generally to an apparatus for clock phase alignment. In such an embodiment, a first circuitry loop is configured to align a first clock signal in a physical medium attachment clock domain to a second clock signal in a physical coding clock domain by adjusting phase of the first clock signal. A second circuitry loop is coupled to the first circuitry loop. The second circuitry loop is configured to align the second clock signal to the first clock signal by adjusting phase of the second clock signal.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 4 is a block/circuit diagram depicting an exemplary embodiment of a transmit output clock path for an example implementation of a portion of the phase/delay aligner system of FIG. 3.

FIG. 11 is a table diagram depicting an exemplary embodiment of a truth table for a bang-bang detector of FIG. 10.

DETAILED DESCRIPTION OF THE DRAWINGS

In the following description, numerous specific details are set forth to provide a more thorough description of the specific embodiments. It should be apparent, however, to one skilled in the art, that the invention may be practiced without all the specific details given below. In other instances, well-known features have not been described in detail so as not to obscure the embodiments. For ease of illustration, the same number labels are used in different diagrams to refer to the same items; however, in alternative embodiments the items may be different. Furthermore, though particular numerical values and/or circuit instances are described herein for purposes of clarity by way of example, it should be understood that the scope of the description is not limited to these particular numerical examples as other values and/or other numbers of circuit instances may be used. For example, even though single instances of signal lines, multiplexers, flip-flops, or other circuit instances may be illustratively depicted, such depictions may represent one or more of such circuit instances.

In the following description, for purposes of explanation, specific nomenclature is set forth to provide a thorough understanding of the various inventive concepts disclosed herein. However, it will be apparent to one skilled in the art that these specific details are not required in order to practice the various inventive concepts disclosed herein.

Figure 1:
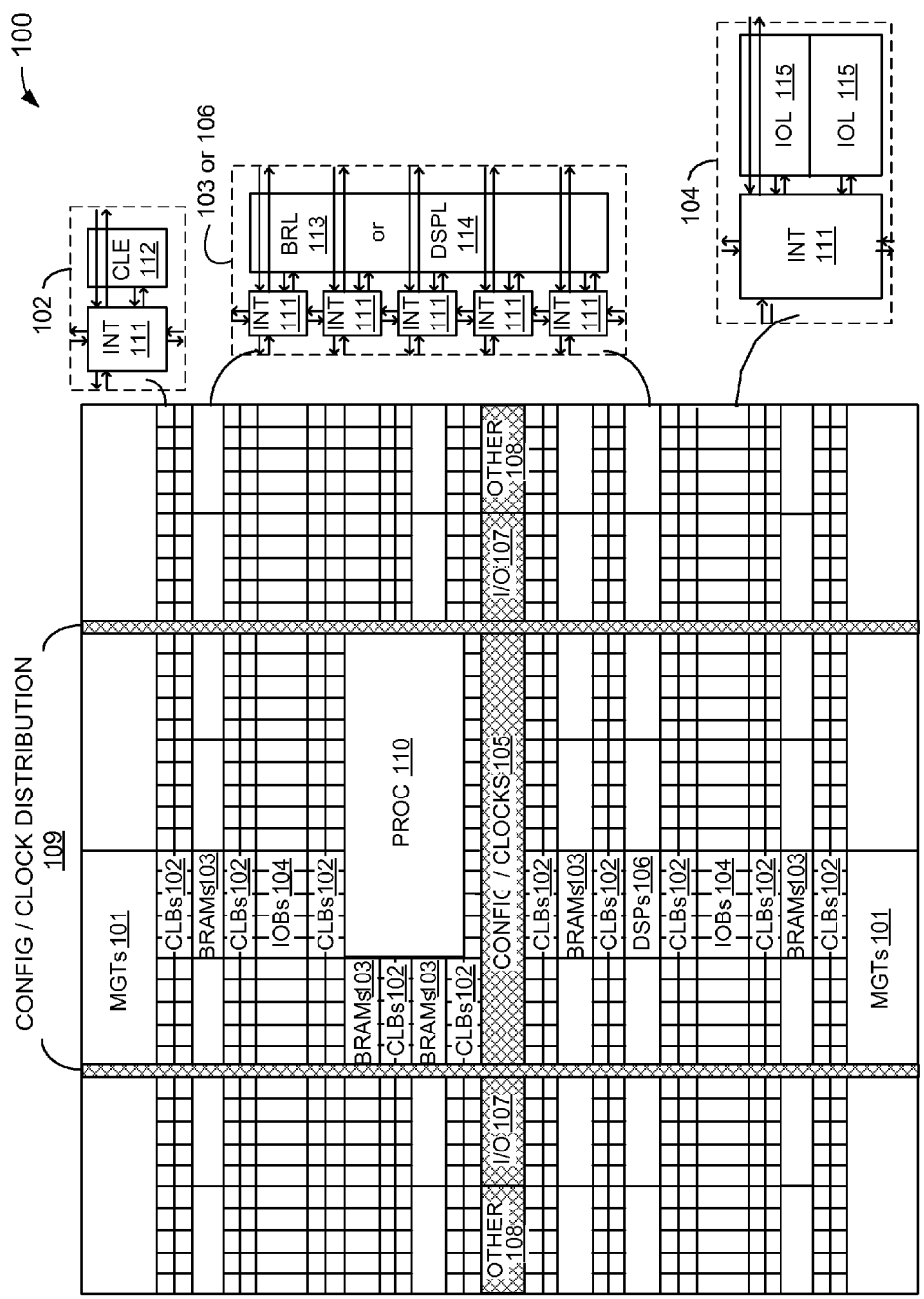
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a horizontal column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
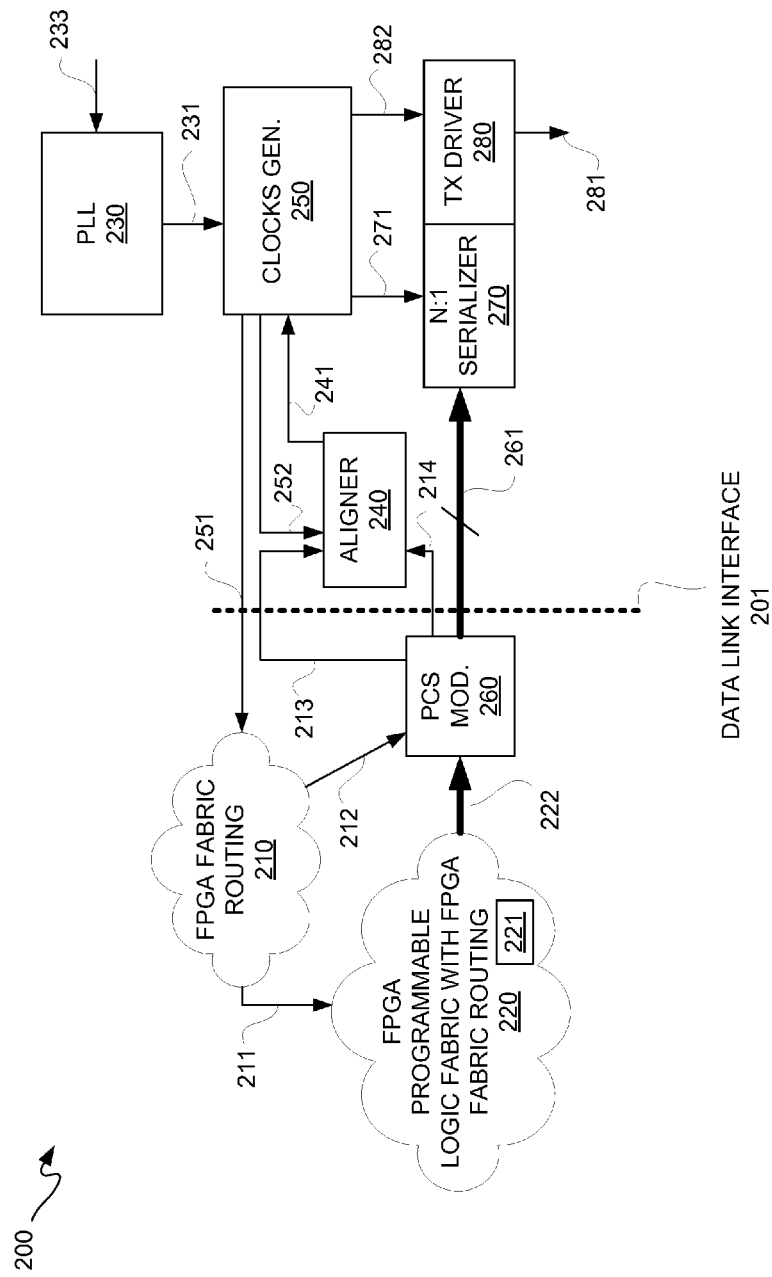
FIG. 2 is a block diagram depicting an exemplary embodiment of a clock adjustment or alignment system for a transmit path.

FIG. 2 is a block diagram depicting an exemplary embodiment of a clock adjustment or alignment system 200 for a transmit path. System 200 may be thought of as a transmit path data link interface. For purposes of clarity by way of example and not limitation, it shall be assumed that the application of clock adjustment system 200 is for a serializer-deserializer ("SERDES") of an FPGA. However, it should be understood that an IC having a transmit path data link interface with fixed or programmable routing, or a combination thereof, may be used.

For a SERDES implemented in an FPGA, there may be some delay paths in an FPGA fabric routed portion, such as FPGA fabric routing 210 and FPGA programmable logic fabric with FPGA fabric routing 220. As is known, configuration bits may be used to configure FPGA fabric routing 210 and FPGA programmable logic fabric with FPGA fabric routing 220, where signal propagation delay is generally known within specified bounds. However, such delay may vary with PVT variation. PVT variation may affect the timing relationship of a data link interface, including either or both a transmit data link interface and a receive the same or a separate data link interface.

Clock adjustment system 200 has a physical coding sublayer ("PCS") clock phase tracking loop, which is used in combination with a physical medium attachment ("PMA") clock phase tracking loop to reduce phase noise of a transmit clock signal, as described below in additional detail. Again, it should be appreciated that even though an FPGA fabric routed path for a data link interface from a PCS clock domain to a PMA clock domain in a SERDES application is described, it should be understood that other applications having a transmit clock domain and an internal clock domain may employ one or more aspects of clock adjustment system 200. More particularly, other applications in which a high speed clock signal, such as a serial clock signal, is used in combination with a lower speed clock signal, such as a parallel clock signal, may employ one or more aspects of clock adjustment system 200.

A phase lock loop ("PLL") 230, which may receive an external clock signal 233, is used to provide a reference clock signal 231 to clocks generator 250. Clocks generator 250 provides a clock signal 251 having a frequency which is a fraction of the frequency of reference clock signal 231. Clock signal 251 may be referred to as a parallel clock signal or a byte clock signal. Even though the term "byte" clock signal is used to refer to clock signal 251 and other clock signals described herein, it should be understood that such "byte" clock signals may be for clocking data which is one or more bytes in width.

Byte clock signal 251 is provided to FPGA fabric routing 210, which provides byte clock signal 251 as byte clock signal 211 to FPGA programmable logic fabric with FPGA fabric routing 220. Because FPGA fabric routing 210 introduces some delay, which may be subject to PVT variation, this clock signal is referred to as byte clock signal 211 and not byte clock signal 251 for purposes of clarity. FPGA programmable logic fabric with FPGA fabric routing 220 may have a user application 221 instantiated in FPGA programmable logic thereof responsive to configuration bits of a bitstream. Accordingly, FPGA programmable logic fabric with FPGA fabric routing 220 may have a data out bus 222 for such user application 221 coupled to a PCS module 260.

PCS module 260 may be coupled to receive byte clock signal 251 with some delay of FPGA fabric routing 210, which is indicated as byte clock signal 212 provided to PCS module 260. PCS module 260 may pass byte clock signal 212 out as another byte clock signal with some additional delay as byte clock signal 213 to aligner 240. Accordingly, it should be understood that byte clock signals 211 through 213 may have various delays, and such delays may be somewhat different from IC to IC both intrinsically or during operation, or some combination thereof, due to PVT variation.

Clocks generator 250 provides a reference byte clock signal 252 to aligner 240 for comparison with byte clock signal 213. Because of the more direct routing of byte clock signal 252 as compared with byte clock signal 213 to aligner 240, byte clock signal 252 has less delay than byte clock signal 213 and byte clock signal 252 is generally subject to less PVT variation than byte clock signal 213. It should be appreciated that byte clock signal 213 from PCS module 260 passes across a data link interface 201 when passing to aligner 240. Likewise, data provided via data bus 261 from PCS module 260 crosses data link interface 201 when passing to serializer 270. In the opposite direction, byte clock signal 251 from clocks generator 250 to FPGA fabric routing 210 passes across data link interface 201. Thus, generally data link interface 201 in this exemplary embodiment delineates PMA and PCS clock domains, namely generally to the right of data link interface 201 in FIG. 2 is the PMA clock domain.

Aligner 240, responsive to comparing byte clock signal 213 and byte clock signal 252, provides a physical interface clock signal 241 to clocks generator 250. Responsive to physical interface clock signal 241 and reference clock signal 231, clocks generator 250 provides a serial clock 271 and a transmit clock 282. Serial clock 271 is provided from clock generator 250 to serializer 270, and transmit clock 282 is provided from clocks generator 250 to transmit driver 280. In this exemplary embodiment, serializer 270 is depicted as an N-to-1 serializer, for N a positive integer greater than one, which is for N generally equal to or greater than 8. Serializer 270 serializes parallel data on data bus 261 responsive to serial clock 271 for providing such serialized data to transmit driver 280. Transmit driver 280 provides serial data output 281 responsive to transmit clock 282 obtained from clocks generator 250.

It should be understood that clock adjustment system 200 is for a transmit path. It should further be understood that byte clock signals 211 through 213, as well as byte clock signal 251, are in a PCS clock domain. It should further be understood that byte clock signal 252 and physical interface clock signal 241, as well as clock signals 231, 271, and 282, are in a PMA clock domain.

Figure 3:
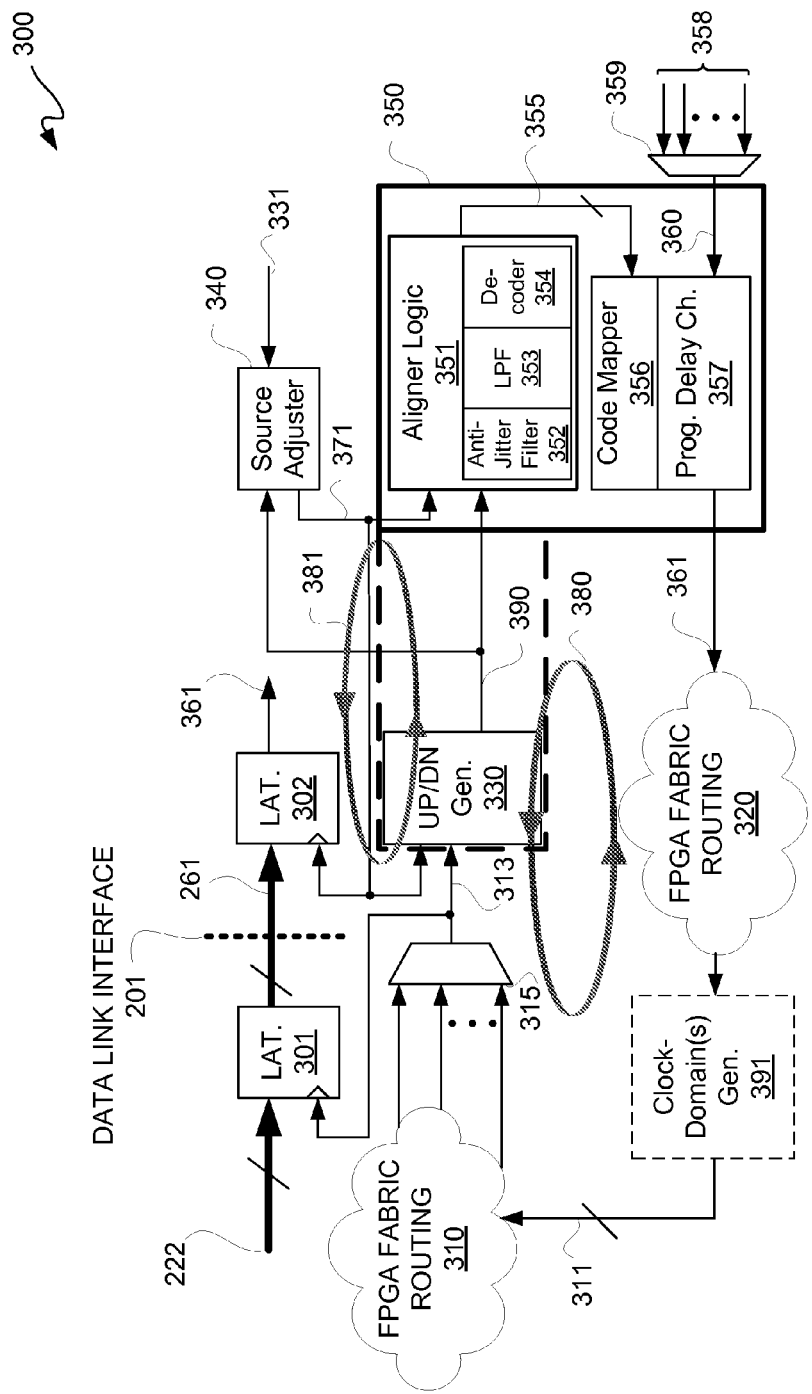
FIG. 3 is a block/circuit diagram depicting an exemplary embodiment of a transmit phase/delay aligner system, which is generally an implementation of the clock adjustment system of FIG. 2.

FIG. 3 is a block diagram depicting an exemplary embodiment of a transmit phase/delay aligner system 300. Generally, phase/delay aligner system 300 is an implementation of clock adjustment system 200 of FIG. 2, and accordingly same reference numbers are used to identify same components.

Generally, phase/delay aligner system 300 includes two clock phase tracking or circuitry loops. A first circuitry loop 381 is used to align a transmit clock signal in a PMA clock domain to an internal clock signal in a PCS clock domain by movement of the transmit clock signal for edge alignment with the internal clock signal. The second circuitry loop 380 is not active while first circuitry loop 381 is active. It should be understood that an internal clock signal is for parallel data and an external clock signal, such as a transmit clock signal in this embodiment, is for serial data, and thus, the internal clock signal is a fraction of the frequency of the transmit clock signal.

Once the transmit clock signal has been aligned to the internal clock signal, circuitry loop 381 is shut off and circuitry loop 380 is activated. Circuitry loop 380 aligns the internal clock signal to the transmit clock signal by moving the phase of the internal clock signal. Movement of the internal clock signal for edge alignment with the transmit clock signal allows the transmit clock signal to be held stable. In other words, the above-mentioned phase noise or jitter associated with adjustment of the transmit clock signal due to PVT variation is avoided. Rather, the internal clock signal is internally adjusted. Adjustment of the internal clock signal due to PVT variation has less overall impact than adjustment of the transmit clock signal due to PVT variation. The benefits of being able to hold the transmit clock signal as phase-aligned over PVT variations is for meeting a low latency data link interface specification or protocol. It should be appreciated that the transmit clock signal is at a much higher frequency, and thus avoiding phase noise in such higher frequency clock signal is more beneficial than having to adjust for phase noise in a lower frequency internal clock signal. Additionally, use of phase/delay aligner system 300 means that a more conventional PLL or DLL, namely one with a wider tolerance range, may be used to save cost and still meet latency targets for a low latency specification or protocol.

Data bus 222 is provided to a data port of latch 301. Latch 301 may be formed using a plurality of D flip-flops. Latch 301 may be part of PCS module 260 of FIG. 2. Data output of latch 301 may be provided across data link interface 201 via data bus 261 to a data input port of latch 302. Latch 302 may be part of serializer 270 of FIG. 2, and serializer 270 may form part of a PMA module, as described below in additional detail.

Latch 302, like latch 301, may be formed of a plurality of D flip-flops. Output of latch 302 may be transmit data which is provided via a transmit data bus 361 to transmit driver 280 of FIG. 2. Latch 302 may be clocked with a serial clock signal 371 obtained from source adjuster 340. Serial clock signal 371 is provided from source adjuster 340 to clock latch 302 and as an input to up/down generator 330.

Another clock input to up/down generator 330 is sourced from multiplexer 315, namely clock signal 313. Clock signal 313 is further provided for clocking latch 301. Serial clock signal 371 is in the PMA clock domain, and clock signal 313 is in the PCS clock domain. Multiplexer 315 may form part of PCS module 260 of FIG. 2.

Source adjuster 340 receives a reference clock signal 331. Reference clock signal 331 may be reference clock signal 231 of FIG. 2. Source adjuster 340 may be portions of clocks generator 250 and of aligner 240 of FIG. 2. Furthermore, up/down generator 330 may form part of aligner 240 of FIG. 2.

In a first alignment mode of operation, circuitry loop or control loop 381 is operative, and circuitry loop or control loop 380 is disabled. Serial clock signal 371 provided from source adjuster 340 is provided to transmit delay aligner block 350 and to up/down generator 330. Again, serial clock signal 371 is also provided to clock latch 302 for providing serial data out on serial data bus 361. Serial clock signal 371 provided to up/down generator 330 is compared with parallel clock signal 313, which is also provided to up/down generator 330, where up-down generator 330 does such comparison.

Up/down generator 330 is configured to detect a difference between phase of such clock signals to indicate which clock signal is to be advanced, or "moved up," or retarded, or "moved down," in phase, if moved at all. Whether serial clock signal 371 or parallel clock signal 313 is moved for alignment depends on alignment mode, as described below in additional detail. It should be understood that even though phase need not be moved at all if both clock signal inputs to up/down generator are in phase with one another, logic may be used to indicate an upward increment in phase for aligned clocks one aligned cycle and such logic may be used to switch to a downward increment in phase for aligned clocks on the next aligned cycle. Thus, alternating up and down increments may be used for aligned cycles. This embodiment may be used to save logic, as indicating a third state, namely an aligned state, may cost more circuitry than just having a leading and lagging states. Accordingly, for purposes of clarity, it shall be assumed that just leading and lagging states are used with alternating up and down increments for aligned conditions. However, it should be understood that with additional circuitry, an aligned state to indicate that there is "nothing to do" may be implemented.

In a first alignment mode of operation, serial clock signal 371 has its phase adjusted for edge alignment with parallel clock 313, where serial clock signal 371 is in a PMA clock domain and parallel clock signal 313 is in a PCS clock domain. In this mode of operation, up/down generator 330 provides coded phase information for edge alignment to parallel clock signal 313. Again, it should further be understood that up/down generator 330 may indicate that edges of clock signals 371 and 313 are aligned, namely are in phase alignment, as well as whether phase is to be retarded or advanced for such alignment, but such implementation is not described for purposes of clarity as it follows from the description herein.

Up/down generator 330 outputs phase/edge alignment information to transmit delay aligner block 350 as well as to source adjuster 340 via signal path 390, which is referred to as edge alignment information 390 for purposes of clarity.

In a first mode of operation, source adjuster 340 uses edge alignment information 390 obtained from up/down generator 330 to adjust phase of serial clock signal 371 for alignment with parallel clock signal 313. After such initial phase alignment, data link interface 201 has an internal PCS clock domain signal and an internal PMA clock domain signal phase aligned for correctly linking the data between these two domains. Furthermore, serial clock signal 371 is aligned for meeting a low latency specification or protocol after such initial alignment mode.

After alignment of clock signals 371 and 313 has been established, circuitry loop or control loop 381 is shut off or otherwise disabled, and circuitry loop or control loop 380 is activated. Up/down generator 330 continues to provide edge alignment information 390 as between clock signals 371 and 313; however, rather than acting upon such edge alignment information 390 by source adjuster 340, such edge alignment information 390 is acted upon by transmit delay aligner block 350. In other words, transmit delay aligner block 350 is activated when control loop 380 is activated, and source adjuster 340 is deactivated when control loop 381 is deactivated.

Edge alignment information 390 is provided to aligner logic block 351 of transmit delay aligner block 350. Aligner logic block 351 may include anti-jitter filter 352, low pass filter 353, and decoder 354. Aligner logic block 351 receives serial clock signal 371, as a relatively stable clock for operation for synchronization with edge alignment information 390.

Effectively, edge alignment information 390 is decoded by aligner logic 351 to provide control signals 355 to code mapper 356 of transmit delay aligner block 350. Code mapper 356 is used to program programmable delay chain 357 of transmit delay aligner block 350 responsive to information provided via control signals 355. An embodiment of aligner logic 351 is described below in additional detail with reference to FIG. 9, where decoder and code mapper are combined.

It should be understood that transmit delay aligner block 350 may form a portion of aligner 240 of FIG. 2. Multiple reference clock signals 358 may be provided as inputs to a multiplexer 359 for selection of a reference clock signal 360 for input to programmable delay chain 357. It should further be understood that a phase alignment block as described herein may be used in multiple applications whose reference sources may be different, as generally indicated by multiple reference clock signals 358.

Programmable delay chain 357 programmed responsive to control signals 355 processed by code mapper 356 and adjusts phase of reference clock signal 360 for phase alignment with serial clock signal 371. Reference clock signal 360 is in a PCS clock domain. Output clock signal 361 from programmable delay chain 357 of transmit delay aligner block 350 is phase-aligned with serial clock signal 371, which is in a PMA clock domain.

Output clock signal 361 is provided to FPGA fabric routing 320. If more clock domains than that associated with output clock signal 361 are implemented, then optionally a clock domain(s) generator 391 may be coupled to FPGA fabric routing 320. Examples of clock domain(s) generator 391 may include a combination of a PLL and a multiplier or a divider, or a combination of a DLL and a multiplier or a divider. For purposes of clarity by way of example and not limitation, it shall be assumed that there are multiple clock domains in the PCS clock domain, and such clock domains are provided at least in part by optional clock domain(s) generator 391. Output of clock domain(s) generator 391 is clock signals 311, which are provided to FPGA fabric routing 310. It should be understood that FPGA fabric routing 310, as well as FPGA fabric routing 320, may have associated delay, and thus clock signals 311 provided as input to multiplexer 315 may have associated delay.

While known delay of FPGA fabric routing may be specified within relatively narrow bounds, FPGA fabric routing 320 and FPGA fabric routing 310 are subject to PVT variation, and such variation may affect phase of clock signals 311. A clock signal of clock signals 311 is selected as a PCS or parallel clock signal 313 output from multiplexer 315 and provided to latch 301 and up/down generator 330 as previously described.

In a second alignment mode of operation, up/down generator 330 provides edge alignment information 390 to transmit delay aligner block 350; however, PCS or parallel clock signal 313 is phase-adjusted for alignment with PMA or serial clock signal 371. This phase adjustment in such second alignment mode is performed by transmit delay aligner block 350 as previously described.

Accordingly, it should be understood that transmit delay aligner block 350 by indicating whether delay is to be stepwise incremented or decremented, or left unchanged in another embodiment, via control signals 355 is used to affect phase of a PCS clock when control loop 380 is active. Thus, up/down generator 330 via edge alignment information 390 indicates whether PCS clock 313 is early or late, or optionally in phase for another embodiment, for inserting delay or removing delay, or leaving delay unchanged for such other embodiment, via programmable delay chain 357.

FIG. 4 is a block/circuit diagram depicting an exemplary embodiment of a transmit output clock path 400 having a PMA module 410 coupled to a PCS module 460 for an example implementation of a portion of phase/delay aligner system 300. Reference clock signals 408 and 409 are respectively input to channel PLL 430, which is a single-channel PLL, and quad PLL 420, which is a multi-channel PLL. Either a multi-channel PLL 420 or a single-channel PLL 430 may be employed during operation as selected for output from multiplexer 421.

Outputs of PLLs 420 and 430 are provided to a multiplexer 421, and output of multiplexer 421 is provided as an input to phase interpolator 412 of aligner block 440. Aligner block 440 also includes a buffer bypass block 411. Reference clocks 408 and 409 are further provided as inputs to multiplexer 431. For purposes of clarity by way of example and not limitation, it shall be assumed that reference clock signal 408 and single-channel PLL 430 clock signal are selected respectively by multiplexers 431 and 421 for use, even though it should be understood that reference clock signal 409 and multi-channel PLL 420 may be selected for use.

Output of multiplexer 431 is provided as a reference clock signal input to multiplexer 432 and as an input to multiplexer 461. Additionally, output of multiplexer 431 may be provided as a reference clock signal to divider block 405, which may be a divide-by-two divider block. Output of divider block 405 may be provided as another input to multiplexer 432. Output of multiplexer 432 may be provided as a reference clock input 470 to transmit delay aligner block 350. Accordingly, it should be appreciated that reference clock 470 may be PCS module 260 output clock signal 214 of FIG. 2 or multiplexer 359 output clock signal 360 of FIG. 3. Output of transmit delay aligner block 350 is clock signal 361, as previously described.

Output of multiplexer 421 provided as a clock signal input to phase interpolator 412 may be PLL 230 output clock signal 231 of FIG. 2 or source adjuster 340 input clock signal 331 of FIG. 3. Output of phase interpolator 412 is provided as an input to frequency divider block 450. Frequency divider block 450 may form a portion of clocks generator 250 of FIG. 2 or a portion of source adjuster 340 of FIG. 3. Output of phase interpolator 412 may be physical interface clock 241 of FIG. 2.

Frequency divider block 450 may include divide-by-two block 401, a divide-by-four/divide-by-five block 402, and a divide-by-one/divide-by-two/divide-by-four/divide-by-eight block 403. Accordingly, frequency divider block 450 may include multiple taps 404 for selecting a frequency divided clock signal to provide a parallel or byte clock signal 451. Furthermore, taps 404 may be used for providing a serial clock signal 271 and a transmit clock signal 282, which clock signals have been previously described. An output of frequency divider block 450 is a byte clock signal 451. Clock signal 451 may be clock signal 252 of FIG. 2 or clock signal 371 of FIG. 3.

Clock signal 451 is provided as an input to buffer bypass 411, as a clock signal input to latch 302, as a clock input to transmit delay aligner block 350, and as clock signal inputs to multiplexers 432 and 461. Output of multiplexer 461 is provided as an input to multiplexer 462. Another input to multiplexer 462 is transmit clock signal 463. Transmit clock signal 463 may be any of clock signals 222 of FIG. 2 or 315 of FIG. 3.

Output of multiplexer 462 is clock signal 452. Clock signal 452 is provided as a clock input to latch 301, buffer bypass 411, transmit delay aligner block 350, and multiplexer 432. Multiplexers 461 and 462, as well as latch 301, are part of PCS module 460. Transmit delay aligner block 350, multiplexer 432, divider 405, multiplexer 431, multiplexer 421, PLL 430, PLL 420, aligner 440, frequency divider block 450, and latch 302 are part of PMA module 410.

Depending on mode of operation, control select signals, not shown for purposes of clarity, to multiplexers are used to configure operation of PMA module 410 and PCS module 460. It should be understood that transmit delay aligner block 350 is in a transmit output clock path ("transmit path") 400. Transmit delay aligner block 350 is for compensation for temperature and voltage drift during operation when a transmit FIFO (not shown) is bypassed. Bypassing such transmit FIFO may be done to provide a fixed latency and to facilitate transmit channel alignment. Transmit delay aligner block 350 is used in conjunction with buffer bypass 411. Buffer bypass 411 may include a state machine 413 in accordance with the description herein. However, it should be understood that buffer bypass 411 may be used independently of transmit delay aligner block 350. A PLL reference clock signal may be routed to transmit delay aligner block 350 via clock signal output 470 of multiplexer 432. Such PLL reference clock may be selected based on which PLL is driving a transmission channel, namely PLL 420 or 430.

State machine 413 of buffer bypass 411 is for aligning clocks within transmit path 400. Clocks 451 and 452 are input to buffer bypass 411 for phase alignment thereof. Buffer bypass 411 operates on the same clock that drives the transmit output. Thus, buffer bypass 411 is still active after alignment. To avoid an increase in phase noise on a transmit channel due to periodically updating a transmit clock signal edge, transmit delay aligner block 350 is activated after buffer bypass 411, and more particularly, state machine 413 is in a "frozen" state, namely after an initial alignment of a transmit clock as previously described. Transmit delay aligner block 350 becomes active after transmit phase interpolator 412 and buffer bypass 411. Phase interpolator 412 and buffer bypass 411 in combination have a sufficient range for aligning any two clocks of interest, such as for performing an initial alignment of clock signals 451 and 452. Such alignment between clock signals 451 and 452 is maintained by transmit delay aligner block 350, even though during operation there may be voltage and temperature variation.

Figure 5A:
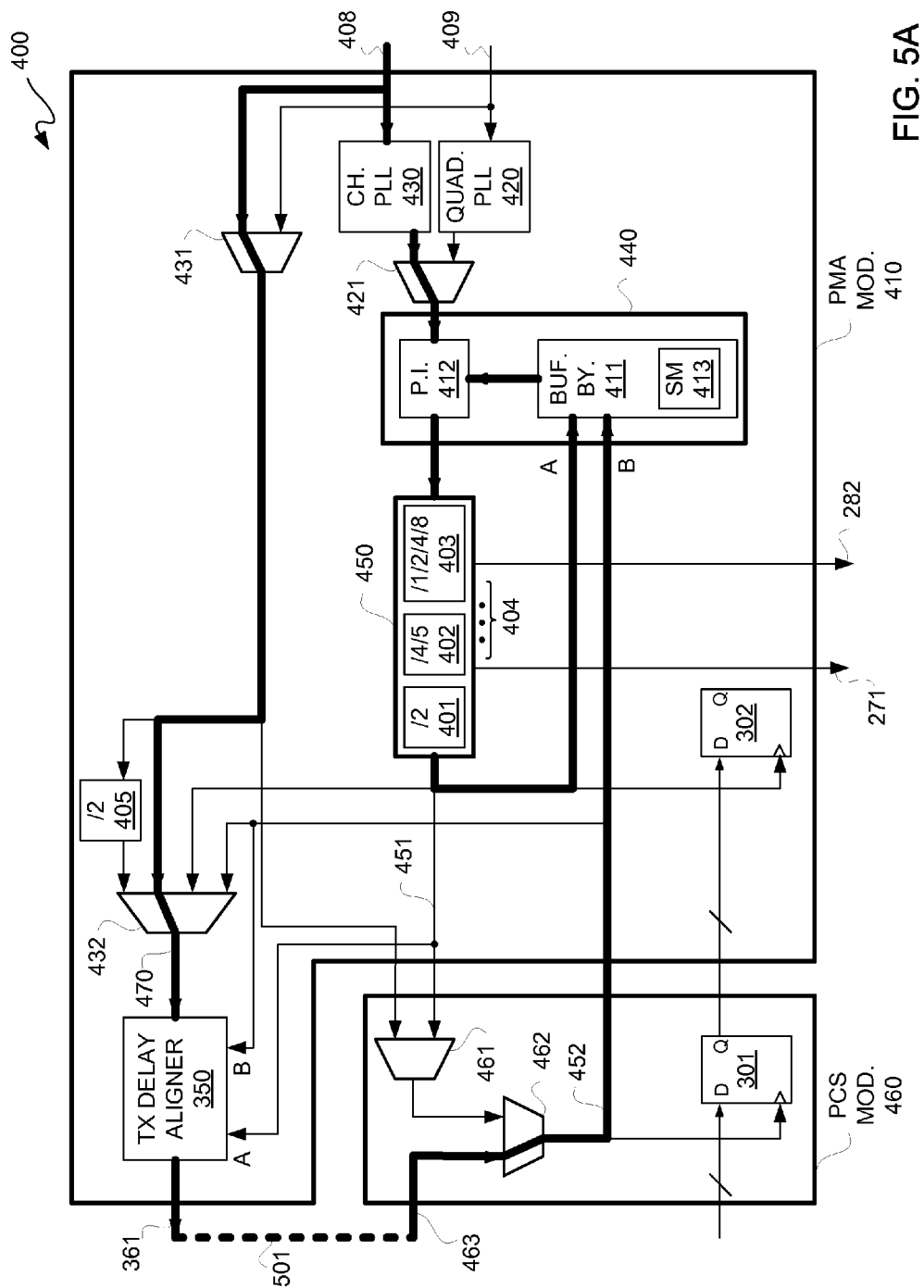
FIGS. 5A and 5B are block/circuit diagrams depicting respective exemplary embodiments of transmit buffer bypass modes for the transmit output clock path of FIG. 4.
Figure 5B:
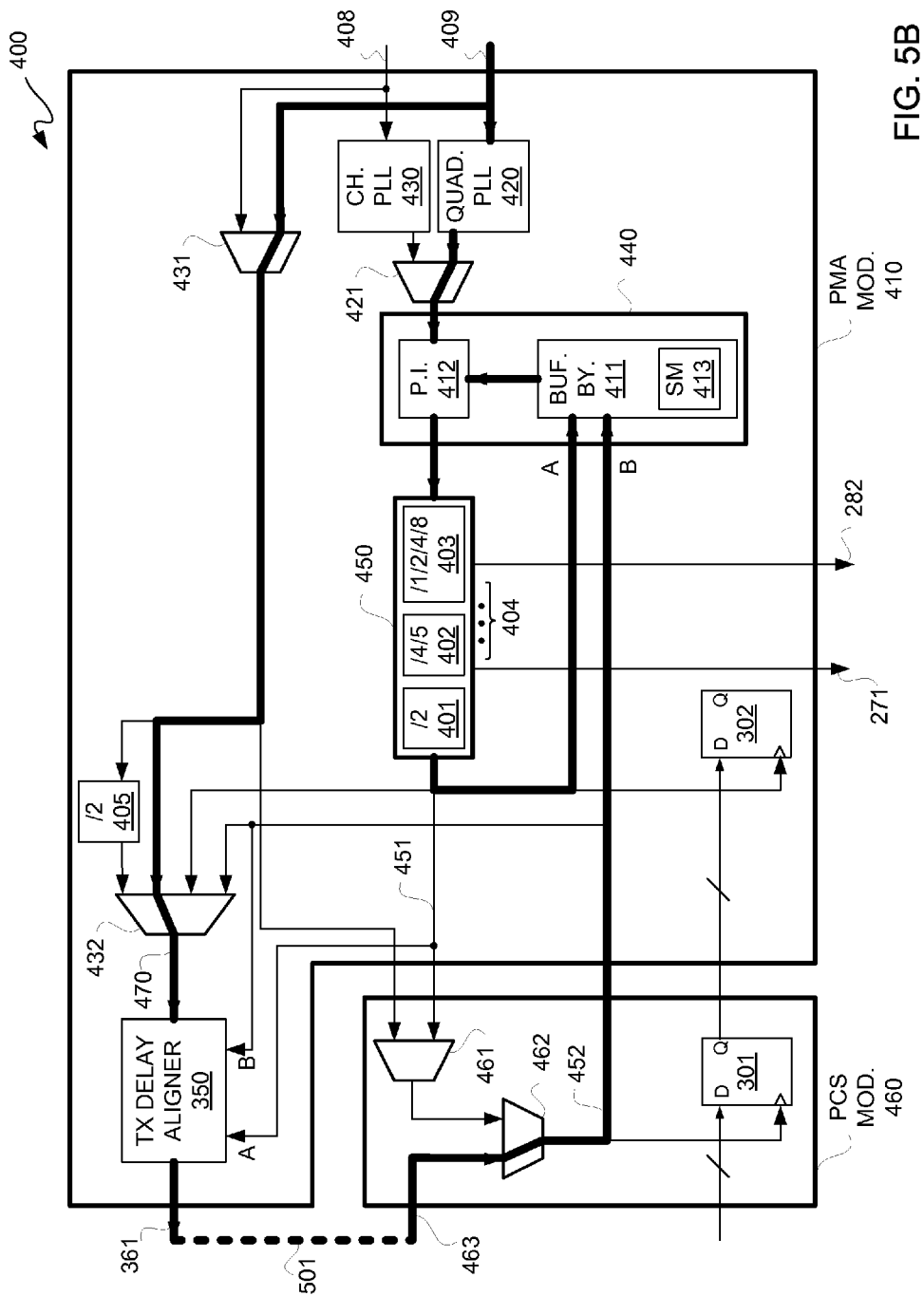

Two transmit buffer bypass modes are illustratively depicted in FIGS. 5A and 5B with transmit path 400 of FIG. 4. In FIGS. 5A and 5B, dashed line 501 is to indicate an application, such as FPGA fabric routing and FPGA programmable logic fabric with such FPGA fabric routing, as previously described with reference to FIG. 2. The thick lines in FIGS. 5A and 5B indicate the general flow of clock signals in PMA module 410 and PCS module 460.

In FIG. 5A, a mode where a transmit channel uses a channel PLL 430 as a reference source is illustratively depicted. In FIG. 5B, a mode where a transmit channel uses a quad PLL 420 as a reference source is illustratively depicted. A reason for routing a reference clock source out to a soft core or a user-instantiated design by the channel rather than a direct path from a reference clock pin is because such reference clock source passes through transmit delay aligner block 350. Accordingly, two clocks 451 and 452 routed to transmit delay aligner block 350 and to buffer bypass 411 are of the same frequency at points A and B in each of FIGS. 5A and 5B, as well as in FIG. 4.

Figure 6:
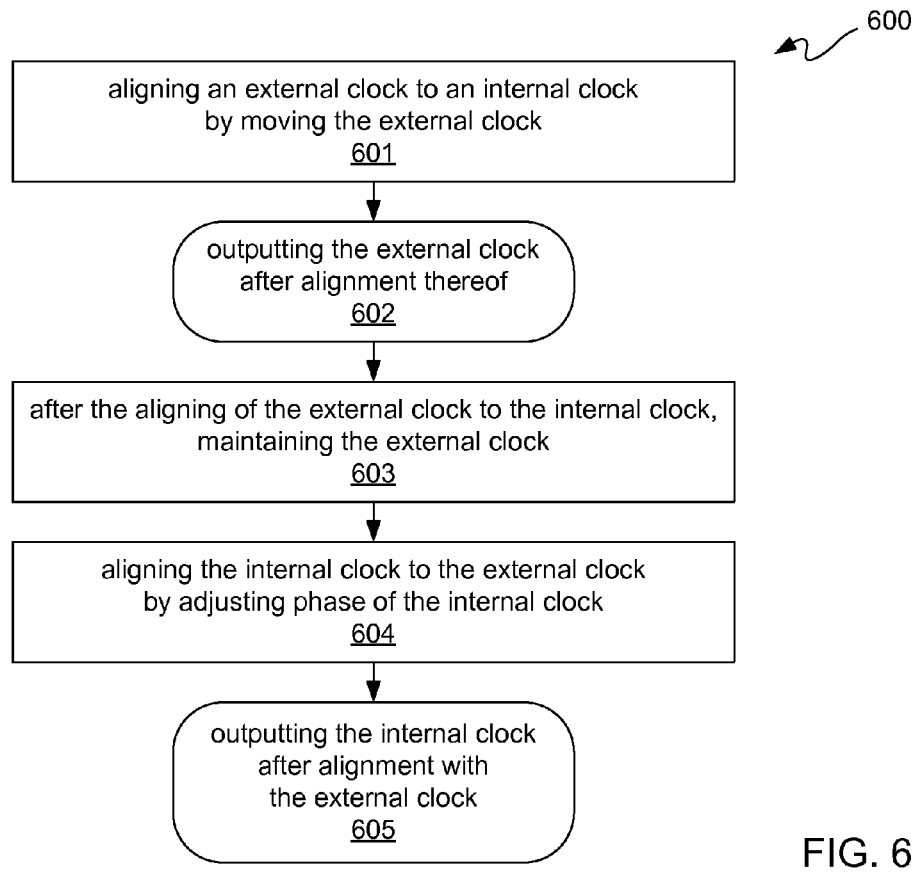
FIG. 6 is a flow diagram depicting an exemplary embodiment of a phase alignment flow.

Turning to FIG. 6, there is shown a flow diagram depicting an exemplary embodiment of a phase alignment flow 600. Phase alignment flow 600 follows from the above description of FIGS. 2 through 4. Even though phase alignment flow 600 is described with reference to a transmit clock as an external clock, it should be understood that a receive clock may be the external clock.

At 601, a transmit clock is aligned to an internal clock by moving the transmit clock. More particularly, an edge of the transmit clock is moved to align with an associated edge of the internal clock. The transmit clock may be a PMA clock for serial data, and the internal clock may be PCS clock for parallel data. At 602, the transmit clock is output after such alignment. For this alignment at 601, programmable delay chain 357 of FIG. 3 may be set to a predefined position. An example of a predefined position may be the middle of such chain or other position. At 601, control loop 381 of FIG. 3 is activated as previously described. Again, this is to adjust a PMA clock to a PCS clock.

After the transmit clock is aligned to the internal clock, as determined at 603, the transmit clock phase is maintained or otherwise left unchanged at 603. At 603, after alignment is achieved as between the transmit clock and the internal clock, control loop 381 of FIG. 3 may be turned off, and control loop 380 of FIG. 3 may be activated. At 604, with control loop 380 activated, the internal clock may be aligned to the transmit clock by movement of the internal clock. More particularly, an edge of the internal clock may be moved for phase alignment with the transmit clock. The internal clock may be moved to maintain phase alignment with the transmit clock even with PVT variation. Accordingly, the transmit clock may be held stable without change so as not to have phase noise in the transmit clock. At 605, the internal clock may be output across a data link interface after alignment with the transmit clock.

Figure 7:
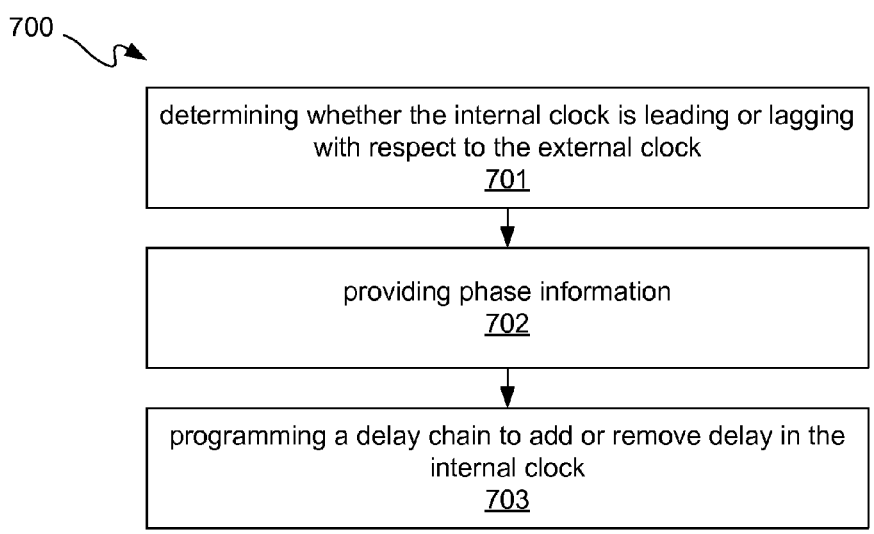
FIG. 7 is a flow diagram depicting an exemplary embodiment of operations for aligning an internal clock signal to a transmit clock signal as part of the phase alignment flow of FIG. 6.

FIG. 7 is a flow diagram depicting an exemplary embodiment of operations 700 for aligning at 604 of FIG. 6. Again, while operations 700 are described in terms of a transmit clock as an external clock, a receive clock as the external clock may be substituted. At 701, it is determined whether the internal clock is leading or lagging, or optionally aligned in another embodiment, with respect to the transmit clock. At 702, phase information is provided in response to the determination at 701. At 703, a delay chain is programmed to add delay or remove delay, or optionally leave delay alone in another embodiment, in the internal clock signal for a leading or a lagging, respectively, internal clock signal with respect to the transmit clock signal. Another state or condition in such other embodiment would be not changing delay of the internal clock signal when aligned with respect to the transmit clock signal.

Figure 8:
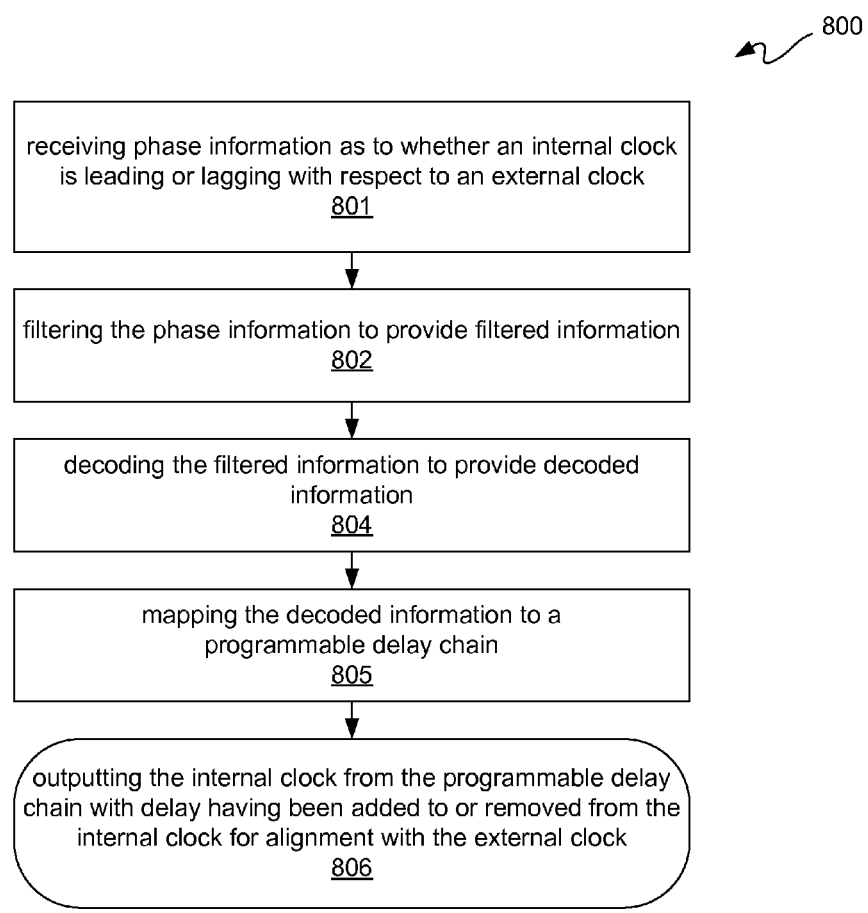
FIG. 8 is a flow diagram depicting an exemplary embodiment of operations for programming a delay chain to add, remove, or leave alone delay as part of the alignment operations illustratively depicted in FIG. 7.

FIG. 8 is a flow diagram depicting an exemplary embodiment of operations 800 for programming a delay chain at 703 of FIG. 7. Again, while operations 800 are described in terms of a transmit clock as an external clock, a receive clock as the external clock may be substituted. At 801, phase information is received indicating whether an internal clock is leading or lagging, or optionally aligned in another embodiment, with respect to the transmit clock signal. At 802, the phase information is filtered to provide filtered information. At 804, the filtered information is decoded to provide decoded information. At 805, the decoded information is mapped to a programmable delay chain, to program the programmable delay chain for edge alignment between the transmit clock and the internal clock. At 806, the internal clock is output from the programmable delay chain, with delay having been added to or removed from, or optionally left unchanged for such other embodiment, the internal clock for alignment with the transmit clock.

Figure 9:
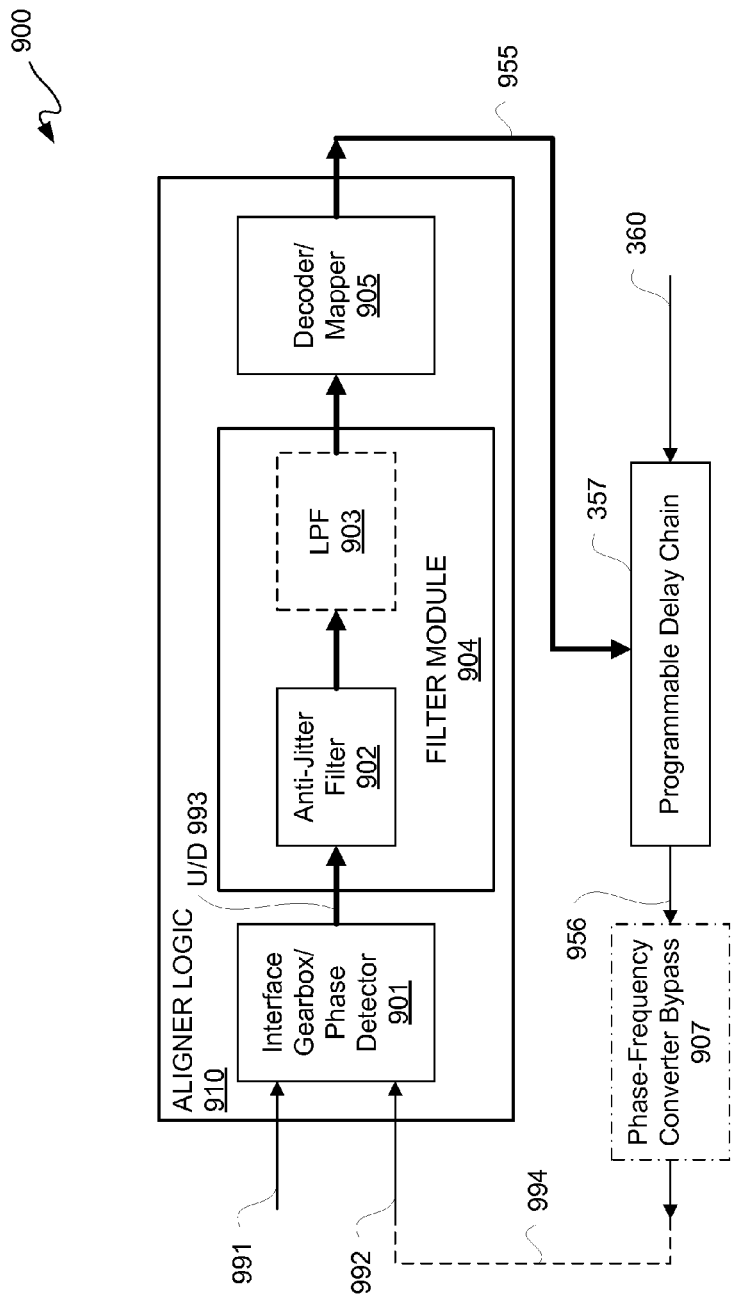
FIG. 9 is a block diagram depicting an exemplary embodiment of a delay aligner block.

FIG. 9 is a block diagram depicting an exemplary embodiment of a delay aligner block 900. Delay aligner block 900 may be used for transmit delay aligner block 350 and up/down generator 330 of FIG. 3. Accordingly, up/down generator 330 may be incorporated as part of aligner block 350, though broken out in FIG. 3 for purposes of clarity. Moreover, delay aligner block 900 may be used for a transmit path, a receive path, or both a transmit path and a receive path, of a data link interface.

Delay aligner block 900 includes aligner logic 910 and programmable delay chain 357. Optionally, a phase-frequency converter bypass 907 may be used. Phase-frequency converter bypass 907 may be for an external PLL with respect to an IC in which delay aligner block 900 is embedded. However, for purposes of clarity by way of example and not limitation, it shall be assumed that phase-frequency converter bypass 907 is not present in the following description.

Aligner logic 910 includes interface gearbox/phase detector 901, filter module 904, and decoder/mapper 905. A clock signal 991 and a clock signal 992 are input to interface gearbox/phase detector 901. Clock signal 991 may be for serial data of either a transmit path or receive data path, and clock signal 992 may be for parallel data of such transmit or receive data path, respectively.

Generally, phase detector 901 determines whether clock signals 991 and 992 are in-phase. Clock signal 992 is a feedback clock signal from the output of programmable delay chain 357 and then routed through routing, including fixed or programmable routing, as previously described and as generally indicated by dashed line 994. Clock signal 991 may be clock signal 371 of FIG. 3, and clock signal may be clock signal 313 of FIG. 3. However, clock signals 991 and 992 may be multiplexed inputs from receive side and transmit side clock signals, as shall become apparent.

After an initial phase adjustment of clock signal 991, such as clock signal 371 of FIG. 3, clock signal 991 may be maintain relatively constant and phase of clock signal 992, such as clock signal 313 of FIG. 3, may be adjusted for being in phase with that of clock signal 991, as previously described.

Interface gearbox 901 is used to switch as between whether clock signals 991 and 992 are for a receive path or a transmit path. Interface gearbox 901 may be implemented with multiplexers, as described below in additional detail.

Phase detector 901 provides an up/down indication, as generally indicated by up/down signal 993, for indicating whether the phase of clock signal 992 may be advanced or delayed in order to be phase aligned with the phase of clock signal 991. Accordingly, phase detector 901 may be thought of as up/down generator 350 of FIG. 3.

It should be understood that it is possible that clock signals 991 and 992 are phase aligned, and phase detector 901 could be configured to provide an indication of such alignment. However, such indication would mean having to include additional circuitry. Thus, for purposes of clarity by way of example and not limitation, it shall be assumed that interface gearbox/phase detector 901 is configured to provide either an up or a down indication when phases of clock signals 991 and 992 are aligned. Accordingly, if clock signals 991 and 992 stay in phase for multiple cycles, the "up" indication on a subsequent cycle would promote a down indication on a next cycle, and there may be some up down perturbation, which may be smoothed out, as described below in additional detail.

Up/down signal 993 is provided as an input to filter module 904, and more particularly to anti-jitter filter 902 of filter module 904. Anti-jitter filter 902 may be configured as an accumulator to accumulate up/down indications over cycles in order to adjust phase of clock signal 992 for maintaining alignment with clock signal 991 over PVT variations. Output of anti-jitter filter 902 may be provided to an optional low-pass filter 903. Effectively, low-pass filter 903 may be used to smooth out the output of anti-jitter filter 902. For example as previously described, if clock signals 991 and 992 were oscillated between an up increment and a down increment, low-pass filter 903 may be used to smooth out such perturbations such that settings of programmable delay chain 357 are more gradually adjusted.

Output from anti-jitter filter 902, or optional low-pass filter 903 if present, is provided to decoder/mapper 905. For purposes of clarity, a decoder and a mapper are combined in FIG. 9; however, it should be understood that a mapper may be separate from a decoder, such as for a block of a programmable delay chain.

Decoder/mapper 905 provides control signals 955 to programmable delay chain 357 for setting delay thereof, as described below in additional detail. A reference clock 360, namely a clock having the same frequency as clock signal 992 may be provided as an input to programmable delay chain 357. Programmable delay chain 357 may have delay set responsive to control signals 955 such that output clock signal 956 when effectively provided as a feedback clock signal 992 to phase detector 901 may be in-phase with clock signal 991.

Again, it should be understood that interface gearbox/phase detector 901 may be up/down generator 330 of FIG. 3. It should further be understood that aligner logic 351 of FIG. 3 includes anti-jitter filter 352, low-pass filter 353, and decoder 354. Anti-jitter filter 352 may be anti-jitter filter 902, and low-pass filter 353 may be optional low-pass filter 903. Furthermore, in FIG. 3 decoder 354 and code mapper 356 were separated out for purposes of clarity, however, again, it should be understood that such blocks may be combined into a decoder/mapper block 905 for producing control signals 955. It should further be understood that reference clock signal 360 may be obtained from a clock generator, such as clock generator 250, where clock generator produces multiple clocks of the same frequency but with different phases. Thus, reference clock signal 360 may be a clock signal with a selected phase.

Delay aligner block 900 may be used in an alignment loop for delay compensation. Again, an external frequency or phase converter, such as including a PLL or DLL, may be coupled via optional phase-frequency converter bypass 907 to enhance flexibility, including for compensation applications across different clock domains. Moreover, reference clock 360 may be obtained from such an external frequency or phase converter.

As described herein, there may be separate alignment adjustment loops in transmitter and receiver paths for associated data link interfaces. As described herein, there are two alignment adjustment loops in each of a transmitter path for a transmit side data link interface and a receiver path for a receive side data link interface. As previously described, in a transmitter path data link interface, an initial alignment loop is used to adjust phase of a transmit serial clock to an internal parallel data clock or byte clock, and a second loop is for phase alignment by adjusting an internal parallel data or byte clock signal to such serial transmit clock signal. In a transmitter path, one of such aligned clocks may be stable or from one or more stable sources. In a receiver path however, all clock signals should be generally aligning with an incoming data stream. Such incoming data stream however may include jitter, noise (including phase noise), spread-spectrum clocking ("SSC") modulation, inter-symbol interference ("ISI") or other interference, or some combination thereof. While it is possible to have transmitter and receiver paths be separate from one another as, such a design consumes circuit resources. However, as described herein, a single delay aligner block 900 may be used for both transmitter and receiver paths for associated data link interfaces. Furthermore, this duality of capability facilitates such set of blocks of delay aligner block 900 to be located in various other applications, namely to facilitate broad reuse of such design.

In the following detailed description of exemplary embodiments of circuits for implementing delay aligner block 900, "universal" control logic is described. Such "universal" control logic may be used in a programmable delay loop in both transmitter and receiver paths. Such programmable delay loop may be used in a SERDES or in another delay compensation application implemented with a programmable delay chain 357. Furthermore, it should be understood that such "universal" control logic may be used for same or similar loops in applications other than a SERDES implemented in an FPGA, and more particularly other applications other than a SERDES.

Delay aligner block 900 illustratively depicts a digital implementation. However, in another embodiment of delay aligner block 900, an analog implementation may be used. For an example analog implementation of delay aligner block 900, anti-jitter filter 902 and LPF 903 may be replaced with a loop filter and an analog delay line. In another example analog implementation of delay aligner block 900, decoder/mapper 905 may drive a digital-to-analog converter ("DAC"), and output from such DAC may be used to control an analog delay line that replaces programmable delay chain 357. Accordingly, digital implementations are described herein for purposes of clarity, but not limitation, as analog implementations may be used.

Figure 10:
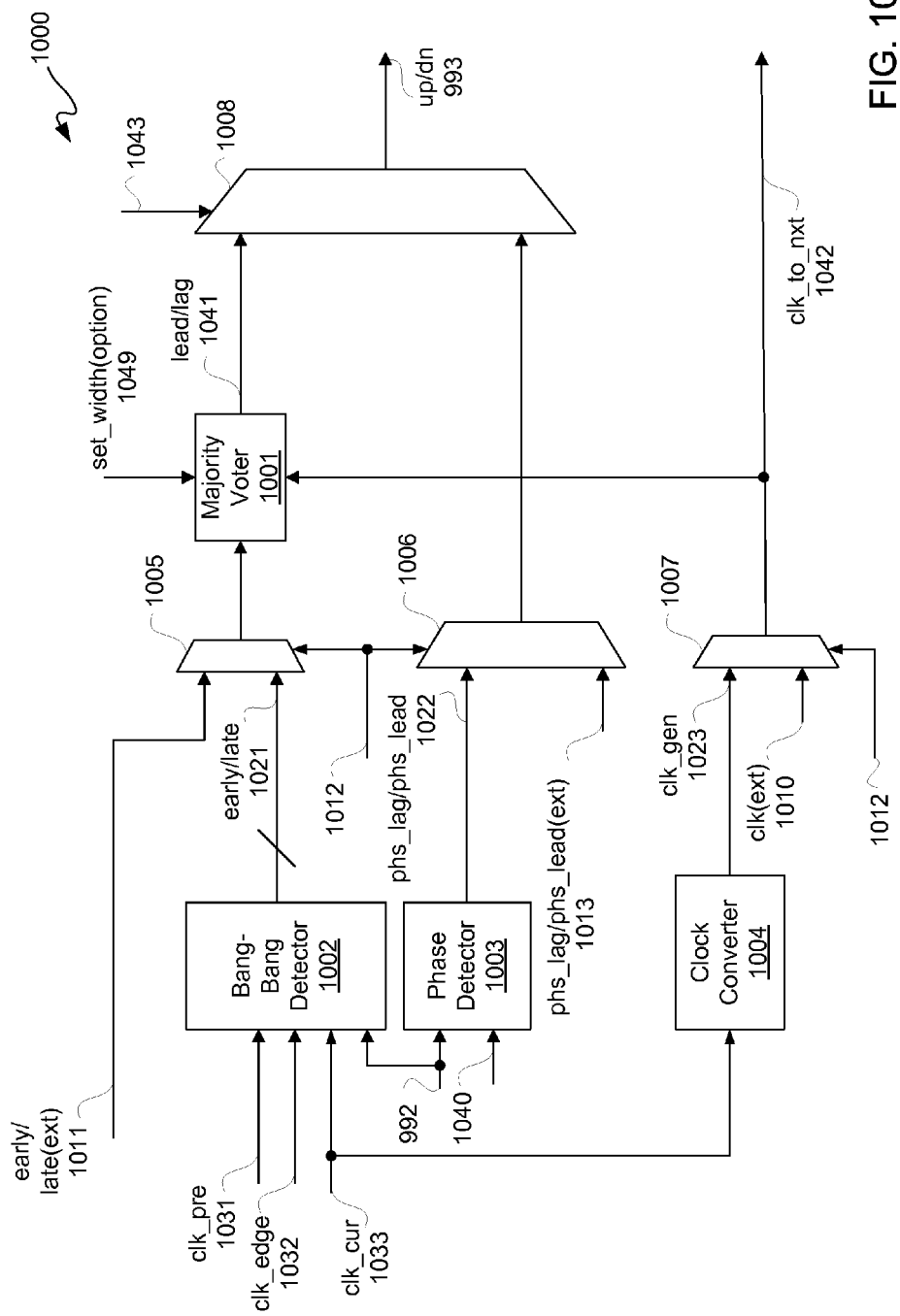
FIG. 10 is a block/circuit diagram depicting an exemplary embodiment of an interface "gearbox" and phase detector block of FIG. 9.

FIG. 10 is a block/circuit diagram depicting an exemplary embodiment of an interface "gearbox" and phase detector block 1000. Interface gearbox and phase detector block 1000 may be interface gearbox/phase detector 901 of FIG. 9. Interface gearbox and phase detector 1000 includes majority voter 1001, bang-bang detector 1002, phase detector 1003, and clock converter 1004, as well as multiplexers 1005 through 1008. Multiplexers 1005 and 1007 are for test purposes only. In other words, multiplexers 1005 and 1007 may be omitted.

For test purposes, an early/late external signal 1011 may be provided as an input to multiplexer 1005, which is selected by a control/select signal 1012 provided to multiplexer 1005. Furthermore, in a test mode, an external clock signal 1010 may be provided as an input to multiplexer 1007, which may be selected by control/select signal 1012 for output from multiplexer 1007. Additionally, multiplexer 1006 is for test mode purposes, and may be omitted. Multiplexer 1006 receives phase lag/phase lead external signal 1013 as an input for output therefrom during a test mode. However, for purposes of clarity, it shall be assumed that a test mode is not invoked, and multiplexers 1005, 1006, and 1007 are omitted, or if present, control/select signal 1012 is not asserted such that early/late signal 1021, phase lag/phase lead signal 1022, and clock generator signal 1023 are all output respectively from multiplexers 1005 through 1007.

Bang-bang detector 1002 is coupled to receive previous phase clock signal 1031, clock edge signal 1032, current clock signal 1033, and feedback clock signal 992. Clock signals 1031 through 1033 are generally depicted in FIG. 9 as clock signal 991. Current clock signal 1033 is further provided to clock converter 1004. Phase detector 1003 receives clock signal 1040 and feedback clock signal 992. Clock signal 1040 may be clock signal 991 of FIG. 9, and more particularly clock signal 1040 may be clock signal 371 as phase detector 1003 is for a transmit path.

Output of bang-bang detector 1004 is early/late signal 1021. Output of phase detector 1003 is phase lag/phase lead signal 1022. Signals 1021 and 1022 are for providing up/down signal 993.

Bang-bang detector 1002 is configured to perform a window compare. Phases of clock signals 1031, 1032, and 1033 are define a window which is compared against clock signal 992. Bang-bang detector 1002 indicates whether phase of clock signal is early or late with respect to such window, and provides such indication with early/late signal 1021. It should be understood that early/late signal 1021 is for a receive path.

Bang-bang detector 1002 is effectively a phase detector that uses phases of three clock signals. More details regarding bang-bang detector 1002 may be found in an article entitled "Clock Recovery from Random Binary Signals," by J. D. H. Alexander, Electronics Letters, vol. 111, pp. 541-542, October 1975.

It should be understood that optionally an external bang-bang detector may be used instead of an internal bang-bang detector 1002 as an option. Thus, an external bang-bang detector may be useful if phase information may be provided therefrom for reuse in shared blocks.

FIG. 11 is a table diagram depicting an exemplary embodiment of a truth table 1100 for bang-bang detector 1002 of FIG. 10. Accordingly, signal states for each of clock signals 1031 through 1033 are depicted and associated outcomes therefor are depicted for early/late signal 1021. It should be appreciated from truth table 1100 that whether a current clock signal 1033 is early in phase or late in phase, namely may be delayed or advanced in phase, respectively, is mutually exclusive except for two conditions, namely the conditions indicated in rows 1101 and 1102. For row 1101, each of clock signal 1031 through 1033 is in a logic low state, and early/late signal 1021 has both an early bit 1021E and a late bit 1021L at logic low levels. Moreover, for the condition when all of clock signals 1031 through 1033 are at a logic high state, both an early bit 1021E and a late bit 1021L of early/late signal 1021 are at logic low levels.

Returning to FIG. 10, output of bang-bang detector 1002, namely early/late signal 1021, is provided as an input to multiplexer 1005, which for non-test or force mode, produces early/late signal 1021 for input to majority voter 1001. Majority voter 1001, which may be implemented using combinatorial logic, is configured to compare the number of late bits and the number of early bits within a set window. The size of this window may be adjusted with set window width option signal 1049. It should be understood that set width 1049 is optional, as a default size for a window width may be implemented. However, it shall be assumed for purposes of clarity and not limitation that set width option 1049 is used.

Again, set width signal 1049 is to select the number of inputs, namely the late plus early bits, to perform what may be called a voting operation. For example, suppose there are ten sample inputs into majority voter 1001, and further suppose that only the first six inputs may be considered with respect to voting. Thus, set width option signal 1049 may be used to set the sample size window to the first six sample inputs and not to take into consideration all ten sample inputs.

Thus, based on the bits in the defined window, majority voter 1001 is configured to make a lag/lead decision according to which of these conditions has more bits, namely more early or late bits, within such defined window. A lead or lag indication is provided from majority voter 1001 as an input to multiplexer 1008 in the form of lead/lag signal 1041.

Majority voter 1001 may be clocked responsive to clock-to-next signal 1042, which may be sourced from the output of multiplexer 1007. Current clock signal 1033 in additional to being provided as an input to bang-bang detector 1002 is provided as an input to clock converter 1004. Clock converter 1004 may be thought of as a multiple ratios clock divider. By multiple ratios, it should be understood that clock converter may be used for providing any of a number of divide by operations, such as divide by two, divide by four, divide by eight, etc. Output of clock converter 1004 is clock generated signal 1023, which is provided as an input to multiplexer 1007, along with optionally external clock signal 1010.

In a non-test mode, clock generated signal 1023 is output from multiplexer 1007 as clock-to-next signal 1042. Because clocking of majority voter 1001 may be slower than input clocking, such as the clock frequencies of clock signals 1031 through 1033, which are all at the same frequency, clock converter 1004 may be used to provide a slower clock to majority voter 1001 than such input clocking. Accordingly, clock-to-next signal 1042 may have a lower frequency than that of clock signals 1031 through 1033.

Clock signals 992 and 1040 are input to phase detector 1003. Phase detector 1003 compares clock signal 992 to serial clock signal 1040 to determine whether the phase of feedback clock signal 992 leads or lags serial clock signal 1040. Output of phase detector 1003 is phase lag/phase lead signal 1022, which is provided as an input to multiplexer 1006.

Phase detector 1003 and multiplexer 1006 may be for a transmit path delay aligner. Optionally, phase detector 1003 may further be configured to receive output from an external phase detector. When multiplexer 1006 is not in a test mode, phase lag/phase lead signal 1022 is output therefrom as an input to multiplexer 1008.

A control select signal 1043 is provided as a control input to multiplexer 1008 in order to select a transmit path or a receive path, namely to select output from multiplexer 1006 or output from majority voter 1001, respectively, for output as up/down signal 993. Up/down signal 993 was previously described with reference to FIG. 9, and such description is not repeated here for purposes of clarity.

Figure 12:
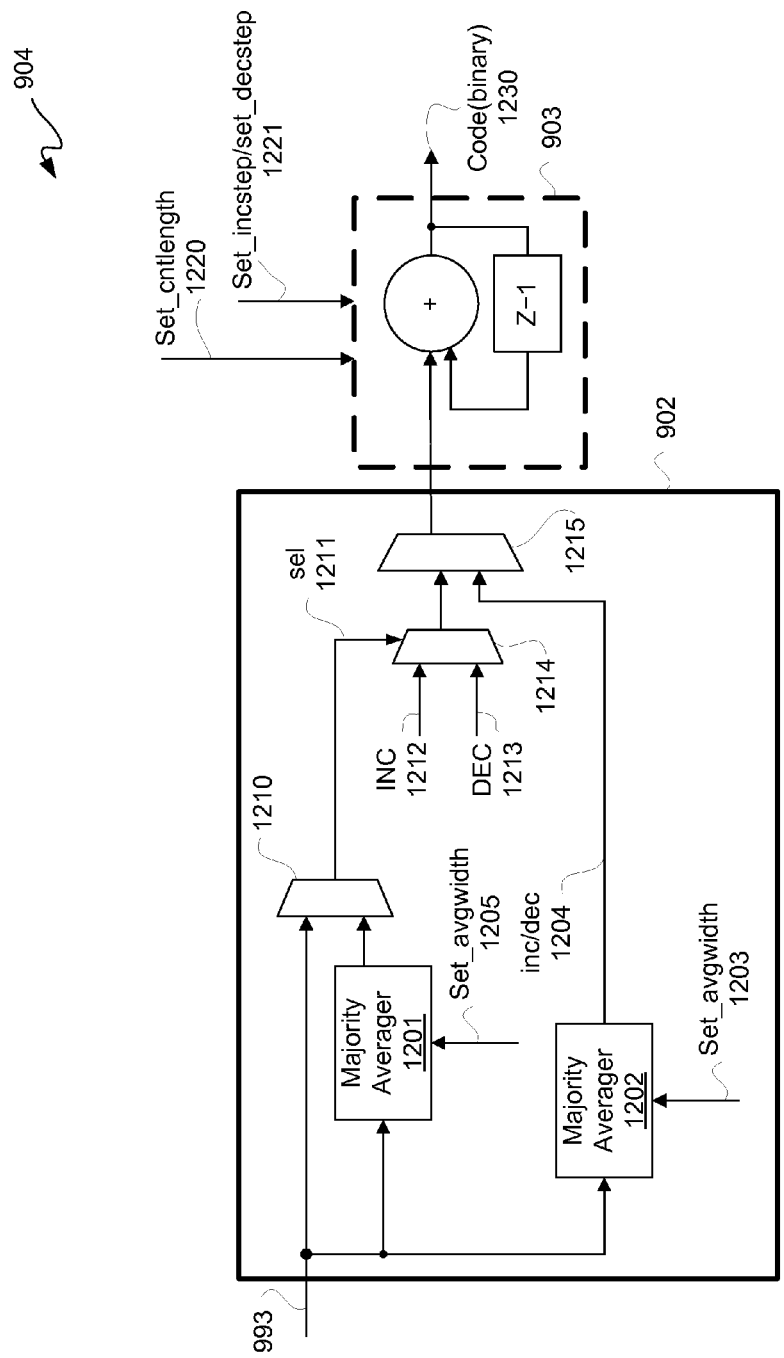
FIG. 12 is a block/circuit diagram depicting an exemplary embodiment of filter module of FIG. 9.

FIG. 12 is a block/circuit diagram depicting an exemplary embodiment of filter module 904 of FIG. 9. Filter module 904, in contrast to interface gearbox/phase detector 1000, is the same for receive and data paths. In other words, there are no separate branches within filter module 904 for transmit and receive paths. Again, filter module 904 includes anti-jitter filter 902 and optional low-pass filter 903. Up/down signal 993 is provided as an input to anti-jitter filter 902.

Anti-jitter filter 902 includes multiplexers 1210, 1214, and 1215, as well as majority averagers 1201 and 1202. Up/down signal 993 is provided as an input to multiplexer 1210, majority averager 1201, and majority averager 1202. Output of majority averager 1201 is provided as another input to multiplexer 1210. Output of majority averager 1202 is provided as increment/decrement signal 1204, which is provided as an input to multiplexer 1215. For purposes of clarity by way of example and not limitation, control select signals have been omitted with respect to multiplexers 1210 and 1215, as operation of those multiplexers shall be understood from the following description.

Majority averager 1201 and majority averager 1202 receive a set average width signal 1205 and 1203, respectively. Majority averager 1201 outputs a one judgment bit at a time to select a fixed increment/decrement step size. Output of majority averager 1202 provides a bus output in the form of increment/decrement signal 1204, which represents how much increase/decrease in size should be put into an accumulator, such as a low-pass filter 903, to improve loop linearity thereof.

Set average width signal 1203 provided to majority average 1202 is to set a number of total input samples (e.g., lead plus one, lag minus one) to be summed up for providing increment/decrement signal 1204. Thus, in one mode of operation of anti-jitter filter 902, up/down signal 993 may be passed as an output of multiplexer 1210 to provide select signal 1211 as a control select signal for multiplexer 1214. Multiplexer 1214 has an increment signal 1212 and a decrement signal 1213 provided as inputs thereto. If up/down signal 993 indicates "up", increment signal 1212 may be output from multiplexer 1214, and if up/down signal 993 indicates "down", then decrement signal 1213 may output from multiplexer 1214. Output of multiplexer 1214 is provided as an input to multiplexer 1215.

Output of multiplexer 1215 is provided as an input to an adder of optional low-pass filter 903. Low-pass filter 903 is not described in unnecessary detail, as low-pass filters are well known. If output from multiplexer 1214 is provided as output from multiplexer 1215, then up/down signal 993 is effectively passed through in the form of increment and decrement signals 1212 and 1213 through anti-jitter filter 902 to optional low-pass filter 903.

Low-pass filter 903 outputs code, such as binary code signal 1230. Low-pass filter 903 may be configured to receive a set-count length signal 1220 and a set-increment step/set-decrement step signal 1221 for setting count lengths and increment and decrement steps, respectively, for purposes of accumulation.

Figure 13:
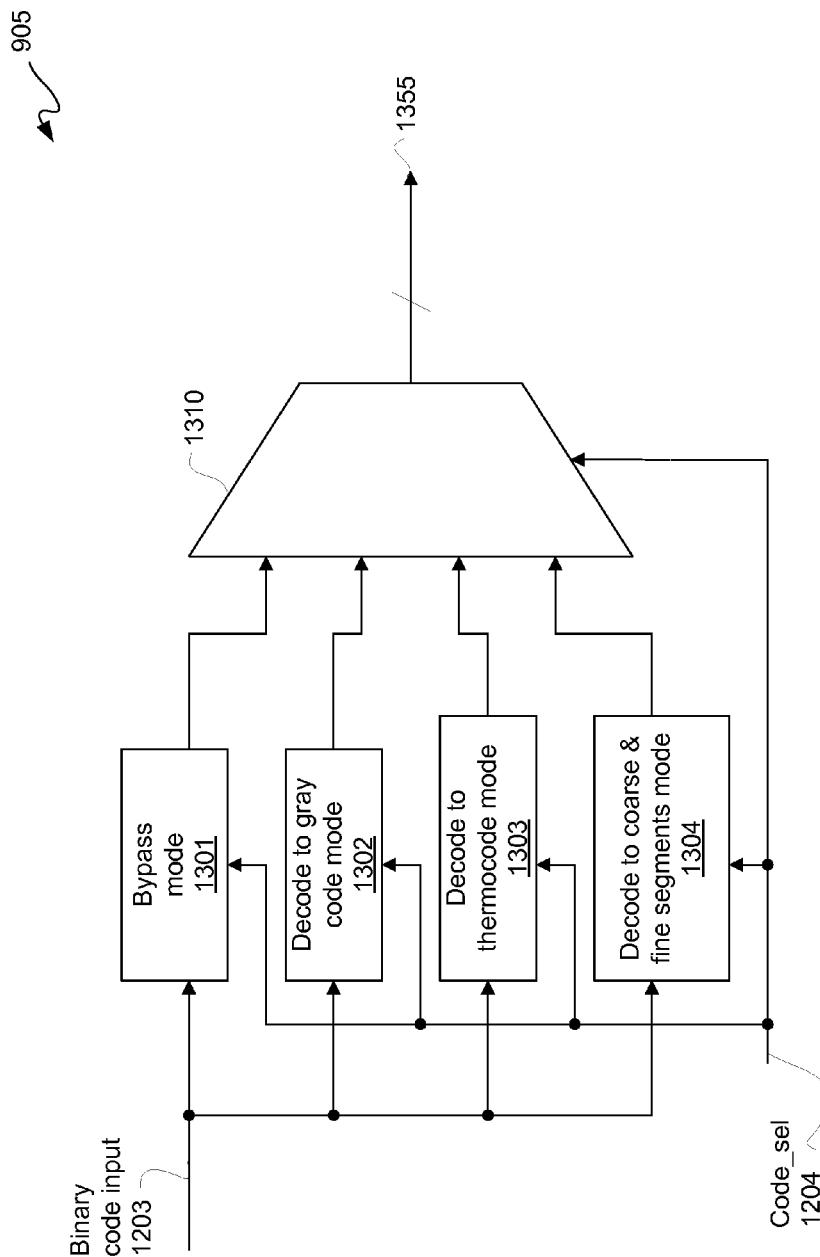
FIG. 13 is a block/circuit diagram depicting an exemplary embodiment of a decoder/mapper of FIG. 9.

FIG. 13 is a block/circuit diagram depicting an exemplary embodiment of a decoder 905. Decoder 905 includes a bypass mode block 1301, a decode to gray code mode block 1302, a decode to thermocode mode block 1303, and decode to coarse and fine segment mode block 1304, as well as multiplexer 1310.

Decoder 905 receives binary code input 1203 and provides such binary code input to each of blocks 1301 through 1304. Code select signal 1204, is provided to each of blocks 1301 through 1304, as well as provided as a control select signal to multiplexer 1301. Code select signal selects which of the four paths in this exemplary embodiment are active. Furthermore, code select 1204 is provided to blocks 1301 through 1304 not only to activate the block that is selected, but to deactivate the three remaining blocks which are not selected. Accordingly, it should be understood that code select signal may be multiple bits in length.

The use of multiple modes provides more universality of design implementation. By having four ways in this exemplary embodiment to handle code, different delay chains, namely chains which use different code formats, may be used.

Bypass mode block 1301 passes binary code input bus 1203 to a mapper for mapping to a programmable delay chain. Again, it should be understood that control signals 1355 is a control bus provided to a mapper, such as control signals 355 provided to code mapper 356 of FIG. 3, for a programmable delay chain, such as programmable delay chain 357 of FIGS. 3 and 9. In a bypass mode, a programmable delay chain may be forced to a particular state, such as for testing when interface gearbox/phase detector 1000 is in a test mode.

Decode to gray code mode 1302 decodes binary code input to a gray code, such that the output of decode to gray code mode block 1303 is a gray code provided as an input to multiplexer 1301 for output therefrom. An output code format for a gray code may have a form of 000 . . . 01, 00 . . . 10,000 . . . 11, etc., for example.

If decode to thermocode mode 1303 is selected, then a thermocode is output from multiplexer 1301 as control signals 1355. In such a mode, binary code input 1203 is decoded to a thermocode by block 1303, which thermocode of decoded binary code input 1203 is provided as output from block 1303 for input to multiplexer 1301. An output code format for a thermocode may be 000 . . . 000, 000 . . . 001, 000 . . . 011, 000 . . . 111, etc., example.

If decode to coarse and fine segment mode 1304 is selected, then block 1304 is active for decoding binary code input 1203. In such a mode, output code format of block 1304 provided as input to multiplexer 1301 for output as control signals 1355 may include one or more coarse segments and one or more fine segments, as associated with such delay segments is a programmable delay chain It should be understood that different segments may have their own format, or may have the same format. In this exemplary embodiment, three segments with a thermocode format may be used. It should be understood that by three segments it is meant that there are two coarse segments and one fine segment. However, it should be understood that other numbers and other combinations of coarse and fine segments may be used, as well as other code formats for their output may be used.

It should be understood that a delay aligner block has been described for a programmable delay alignment loop. Such delay aligner block may be used for either or both transmit and delay paths, and when used for both transmitter and delay paths, such as in a transceiver, circuit resources may be shared among some such paths. Moreover, with different combinations of block decoding modes a delay aligner block as described herein may be used in different circuit environments for compliance with different upper level structures and/or different interfaces of adjacent blocks of such environments. Furthermore, it should be understood that any of a variety of modes, including the four described, may be implemented for decoding for programming a programmable delay chain.

Thus output from a selected one of blocks 1301 through 1304 may be used to effectively set the tick stepping of a programmable delay chain. With respect to coarse and fine segments mode 1304, such mode would depend upon programmable delay chain, namely whether it has both coarse and fine segments and how many of each it may have, as well as the code for those segments. It is presumed for purposes of clarity by way of example and not limitation that such segments within a programmable delay chain all employ the same code; however, if a programmable delay chain had different codes for coarse and fine segments in an embodiment, block 1304 may be configured accordingly.

Figure 14:
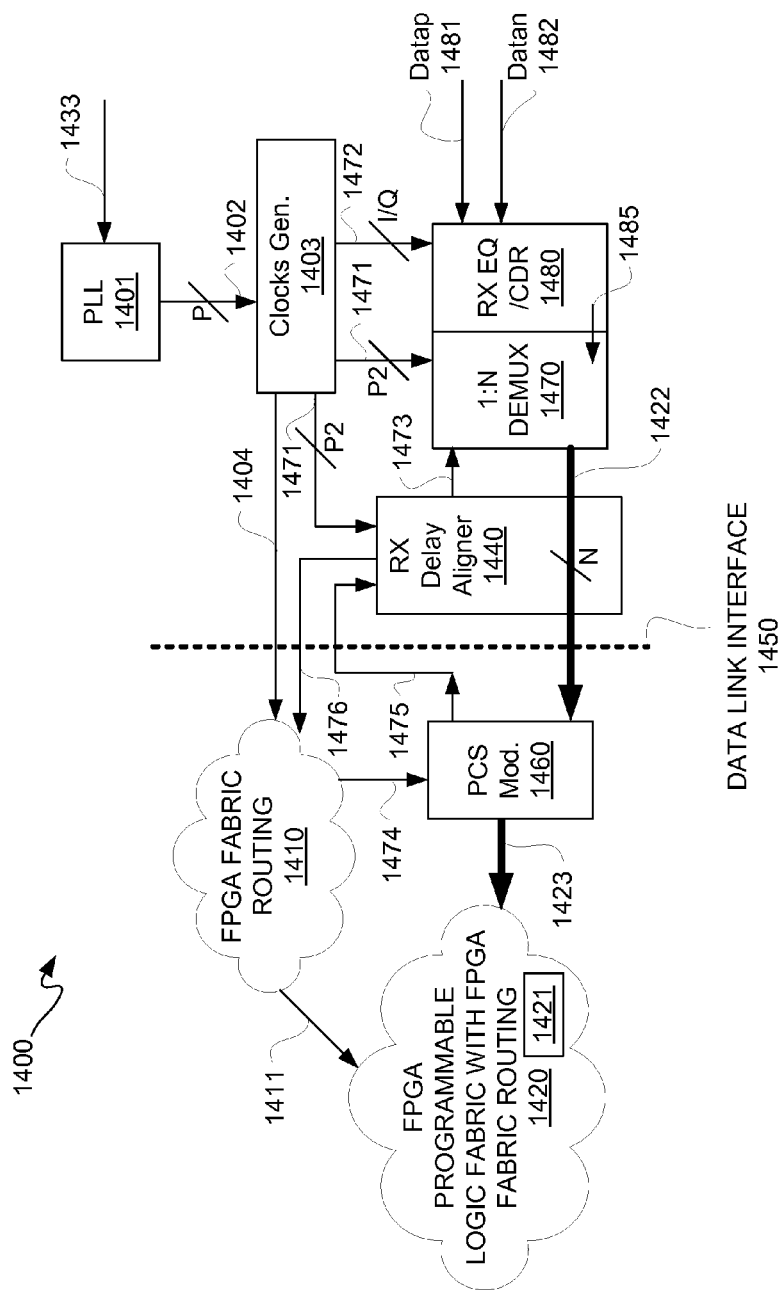
FIG. 14 is a block diagram depicting an exemplary embodiment of a clock adjustment or alignment system for a receive path.

FIG. 14 is a block diagram depicting an exemplary embodiment of a clock phase adjustment or alignment system 1400 for a receive path. System 1400 may be thought of as a receive path data link interface. For purposes of clarity by way of example and not limitation, it shall be assumed that the application of clock adjustment system 1400 is for a SERDES of an FPGA. However, it should be understood that an IC having a receive path data link interface with fixed or programmable routing, or a combination thereof, may be used.

As described below in additional detail, a delay aligner block is used to provide an additional loop for clock phase alignment. Thus one loop is described for an initial alignment of a recovered clock in a PMA clock domain to an internal clock in a PCS clock domain, where phase of the recovered clock is adjusted for alignment to phase of the internal clock. However, once this initial alignment is obtained, an additional loop is used to allow PCS tracking. In other words, a phase of a PCS clock is selected for phase alignment to a recovered clock even though such recovered clock follows incoming data. Thus, phase of a PCS clock is shifted to accommodate changes in phase of a recovered clock associated with incoming data.

A delay aligner block is used for phase alignment to accommodate changes in delay through a fabric routed path, where such delay is generally bounded over PVT variations for normal operation. Accordingly, in an FPGA, such fabric routed portion for a data link of system 1400 from a PMA to a PCS clock domain may be used in a variety of high data rate applications, including SERDES applications. Again, it should be understood that any application where a clock is recovered in a PMA domain, and such clock is to be translated to a PCS clock domain, namely serial to parallel with phase alignment, a delay aligner as described herein may be used. Moreover, even though programmable routing is described, it should be understood that PVT variations may affect fixed routing, or a combination of fixed and programmable routing, and thus a delay aligner and phase alignment loop as described herein are likewise application to such routing.

With this general overview of a data link of system 1400, system 1400 is further described. System 1400 includes PLL 1401, clocks generator 1403, one to N demultiplexer 1407, RX equalization ("EQ") and clock data recovery ("CDR") block 1480, RX delay aligner 1440, PCS module 1460, as well as FPGA fabric routing 1410 and 1420. More particularly, to the right of data link interface 1450 is generally a PMA clock domain and to the left of such data link interface 1450 is generally a PCS clock domain.

PLL 1401, which may receive a reference clock 1433, generates a plurality of clock signals with different phases, namely clock signals 1402. Clock signals 1402 may be all at the same frequency; however, the phases of clock signals 1402 may be varied. Thus, PLL 1401 generally provides stable multiple phases as clock sources 1402.

Clock signals 1402 are provided to clocks generator 1403. Clocks generator 1403 uses P, for P a positive integer greater than two, phases of clock signals 1402 to generate I/Q clock signal phases for phase interpolation in RX equalization and clock data recovery block 1480. More particularly, an I clock 1472 is a sampling clock signal and is used for sampling incoming data, such as may be provided as differential data via data ports 1481 and 1482 to RX equalization and clock data recovery block 1480. Clocks generator 1403 further generates a crossover clock 1472 Q which is provided to RX equalization and clock data recovery block 1480.

So a sampling clock 1472 I samples the center of the data, and a crossings clock 1472 Q samples where data provided via data P 1481 and data N 1482 ports crossover, namely transition logic high to logic low and logic low to logic high, as well as vice versa, for differential data input. Clocks or clock signals 1472 I and 1472 Q may be at the same frequency though at different phases such that the center or eye of the data is captured as well as the crossings of the data. RX equalization and CDR is described in additional detail in a co-pending patent application entitled "Dual-Mode Amplifier," by Toan Dinh Tran, filed on Jan. 22, 2010, assigned application Ser. No. 12/692,105, which is incorporated by reference herein in its entirety for all purposes.

Data obtained from data inputs 1481 and 1482 has an embedded clock, and such embedded clock is recovered by RX equalization and clock data recovery block 1480 to provide clock signal 1485 to demultiplexer 1470. Demultiplexer 1470 is a 1 to N, for N a positive integer greater than one serial to parallel data converter. Clocks generator 1402 provides clocks 1471 to demultiplexer 1470. Clocks 1471 has P2 phases, namely N/2 phases. Clock signals 1471 are all the same frequency but with different phases. Clock signal 1471 is a fraction of the frequency of a recovered clock signal 1485, as clock signal 1471 is for clocking parallel data and a recovered clock signal is embedded with transmitted serial data.

Multiple phases of clock signals 1471 are provided for selecting a clock signal 1471 having a phase for alignment with recovered clock 1485. This selection of a phase of clock signal 1472 is in response to phase selection signal 1473 provided to demultiplexer 1470 from RX delay aligner 1440. With data sampling, effectively a clock signal is obtained for clocking data into demultiplexer 1470; however, data is clocked out of demultiplexer 1470 at the frequency of clock signal 1471. Such data may be provided on data bus 1422 for input to PCS module 1460. It should be understood that data bus 1422 does not just directly pass through RX delay aligner 1440, as illustratively depicted, but rather data is latched described below in additional detail.

Clocks generator 1403 generates a receive side byte clock 1404, which is provided to FPGA fabric routing 1410. FPGA fabric routing 1410 may route such byte clock with additional delay as indicated as byte clock 1411 to FPGA programmable logic fabric with FPGA fabric routing 1420 which may include a user application 1421. It should be understood that FPGA fabric routing 1410, FPGA programmable logic fabric with FPGA fabric routing 1420, and user application 1421 may be or may have circuitry overlap with routings 210 and 220, and user application 221 as described with reference to FIG. 2. It should be understood that data link interface 1450 may be data link interface 201 of FIG. 2. Additionally, clocks generator 1403 may be clocks generator 250 of FIG. 2, and PLL 1401 and PLL 230 may be the same PLL. Even though a PLL may be shared between receive and transmit paths, separate PLLs, as well as separate clocks generators, may be used. Furthermore, PCS module 1460 may be or have some circuitry overlap with PCS module 260 of FIG. 2. Aligner 1440 may be aligner 240 of FIG. 2, or may be a separate delay aligner. More particularly, delay aligner 1440 and delay aligner 240 of FIG. 2 may be delay aligner 900 of FIG. 9.

Byte clock signal 1404 after delay due to FPGA fabric routing 1410 is passed as byte clock signal 1474 to PCS module 1460. Data provided via data bus 1422 to PCS module 1460 may be passed to FPGA programmable fabric with FPGA fabric routing 1420 via data bus 1423. Such data may be clock responsive to byte clock signal 1474. PCS module 1460 may pass a version of byte clock signal 1474, namely byte clock signal 1475, to RX delay aligner 1440.

Clocks 1471 all with the same frequency with P2 phases in addition to being provided from clocks generator 1403 to demultiplexer 1470 are also provided to RX delay aligner 1440. RX delay aligner 1440 is configured to select a phase of P2 phases of clock signals 1471 that is most closely phase aligned with byte clock signal 1475. The selected phase is provided from delay aligner 1440 to demultiplexer 1470, as a phase select signal 1473. Thus it should be understood that a byte clock signal 1475 in a PCS domain is provided having the same frequency as clock signals 1471, to delay aligner 1440 in order to have a reference as to current operation, including any phase change, for selection of a phase which by comparison is most closely the phase of clock signal 1475. Such a selected clock signal of clock signals 1471 having such a phase most closely if not aligned to byte clock signal 1475 is used in a PCS domain. In other words, data input to RX aligner 1440 is clocked responsive to a selected clock signal 1471. By selecting a most closely aligned phase, a data link between PMA and PCS clock domains is more likely to be successful.

In other words, in order to meet setup and hold time parameters for successfully transferring data from demultiplexer 1470 to PCS module 1460, a most closely aligned phase of clock signals 1471 to byte clock signal 1475 is used. Once a clock signal of clock signals 1471 is selected with a phase that most closely is aligned to byte clock 1475, a byte clock 1476 may be provided to FPGA fabric routing 1410, which byte clock 1476 may be used instead of or in addition to byte clock 1404.

Figure 15:
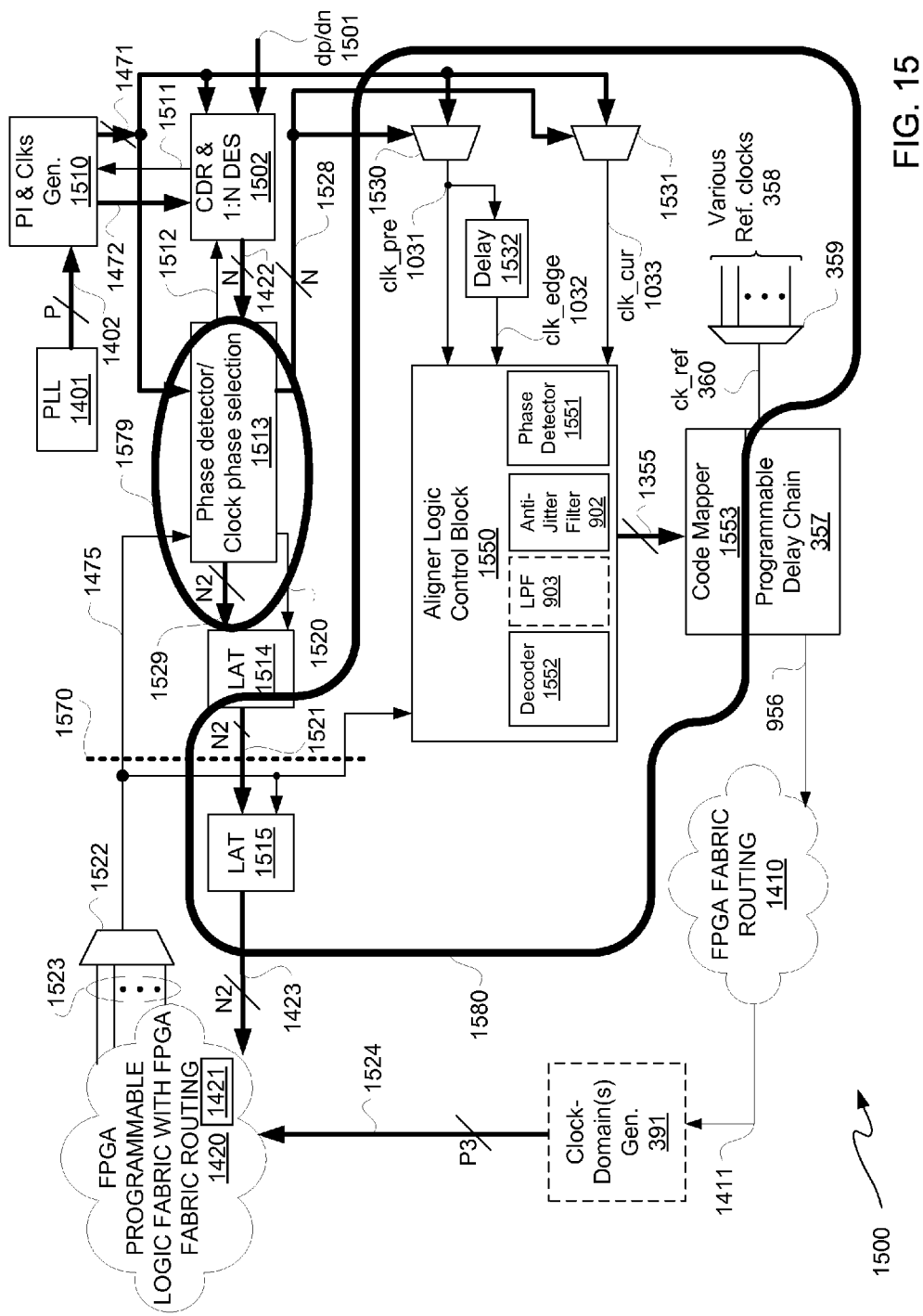
FIG. 15 is a block/circuit diagram depicting an exemplary embodiment of a receive phase/delay aligner system, which is generally an implementation of the clock adjustment system of FIG. 14.

FIG. 15 is a block/circuit diagram depicting an exemplary embodiment of a receive phase/delay aligner system 1500, which is generally an implementation of clock adjustment system 1400 of FIG. 14. With simultaneous reference to FIGS. 14 and 15, system 1500 is further described.

Continuing the above exemplary embodiment, a data link of system 1500 is coupled to FPGA programmable logic fabric with FPGA fabric routing 1420 and FPGA fabric routing 1410 for a SERDES application. A user application 1421 may be programmed into programmable logic fabric 1420, a previously described. Thus it should be understood that an RX data link of system 1500 may be an implementation of an RX data link of system 1400. However, for purposes of clarity by way of example and not limitation, partitioning of the exemplary embodiment of FIG. 15 is somewhat different from the partitioning of the exemplary embodiment of FIG. 14, as system 1500 is described at a lower level of detail than system 1400.

Because total delay of signals passing through routing 1410 and 1420 may change with PVT variations and/or variations of an incoming data phase, a phase adjustment loop 1580 may be used in addition to phase adjustment loop 1579. Loop 1579 is to select one phase of multiple phases of recovered clocks to align with the clock used for an RX data link interface to a PCS clock domain. After such initial alignment, control or phase adjustment loop 1580 is activated or asserted and adjustment or phase control loop 1579 is effectively deactivated for purposes of phase adjustment.

Control loop 1580 is used for alignment of clocks between PCS and PMA clock domains. However, rather than shifting phase in a PMA clock domain to that of a PCS clock domain as performed with control loop 1579, control loop 1580 shifts phase in a PCS clock domain in order to adjust to phase in a PMA clock domain. Thus, control loop 1580 is configured to change phase of a clock used in a PCS clock domain with a recovered clock in a PMA clock domain.

A recovered clock tracks with incoming data as controlled by CDR for data input to 1:N deserializer ("DES") block

1502. Input data may be differential input data ("DP/DN") 1501 and such data may be provided to CDR and deserializer block 1502. PLL 1401 provides multiple phases of clock signals 1402 as previously described to a phase interpolator and clocks generator block 1510. In this exemplary embodiment, phase interpolation and clocks generation is combined into a block 1510.

Phase interpolation and clocks generator block 1510 generates clocks 1472 which are provided to CDR and deserializer block 1502. Blocks 1471 are provided to phase detector/clock phase selection block 1573 as well as input to multiplexers 1530 and 1531. Again, PLL 1401 is used to provide a relatively stable multiple phases of clock sources. Phase interpolator and clocks generator block 1510 is used to provide P2 phases from P phases provided from PLL 1401 to generate I/Q phases for clock signals 1472 for RX CDR and deserializer block 1502 to sample data 1501. Again, P2 is equal to N/2, and P2 phases of clock signals 1471 are provided to CDR and deserializer block 1502, as previously described with reference to demultiplexer 1470.

Phase detector/clock phase selection block 1513 receives P2 phases of clocks signals 1471 and selects a phase most closely aligned with byte clock signal 1475. This selected phase is provided via phase selected signal 1512 to CDR and deserializer 1502 for selection of a clock signal 1471, as previously described with reference to FIG. 14. Thus, for an initial phase alignment by phase adjustment loop 1579, a selected phase of a clock signal of clock signals 1471 in a PMA clock domain is effectively a phase adjustment to for alignment with a phase of clock 1475 in a PCS clock domain. Thus, phase detector/clock phase selection block 1513 forms part of an initial control loop 1579. Once such alignment of a clock 1471 in a PMA clock domain to a clock 1475 in a PCS clock domain is completed, control loop 1579 may effectively be deasserted for assertion of control loop 1580. Accordingly, a selected clock signal of clock signals 1471, or more particularly a phase of a selected clock signal 1471, is provided as PMA select clock signal 1520 for operation of latch 1514. Latch 1514 receives data via data bus 1529 from phase detector/clock phase selection block 1513. The selected clock signal of clock signals 1471 is clock signal 1520, which clock signal is used for clocking data to a PCS clock domain from a PMA clock domain, as described below in additional detail.

Latch 1514 receives data from phase detector/clock phase selection block 1513 via data bus 1529. Such data is provided in parallel with a data width of N2. Bus 1422 has a width of N. The width N is width of a clock bus, and width N2 is width of a data bus.

Data via bus 1529 is clocked into and out of latch 1514 responsive to PMA clock domain signal 1520 for providing as data input to latch 1515 via data bus 1521. Latch 1515 is coupled to receive byte clock signal 1475 for clocking data via data bus 1521 into and out of latch 1515. Latches 1514 and 1515 may each be implemented with multiple delay flip-flops. Accordingly, it should be appreciated that N2 data going from latch 1514 which is clocked with PMA clock domain signal 1520 into latch 1515 which is clocked with a PCS clock domain signal 1475 crosses data link interface 1570, namely a PCS/PMA domain interface. Latch 1515 may be part of PCS module 1460. Latch 1514 may be part of RX delay aligner 1440. Data clocked out of latch 1515 is provided via data bus 1423 to FPGA fabric routing 1420.

Accordingly, it should be understood that control loop 1579 selects a phase of clock signals 1471 for providing a PMA selected clock signal 1520 associated with phase of a recovered clock signal. Such selection facilitates a low latency data link for a PCS clock or byte clock signal 1475 operative within a PCS clock domain of data link interface 1570. At generally the same time of such selection and providing of clock signal 1520, two sets of N/2 phases, or N total phases, are provided as control select inputs 1528 to multiplexers 1530 and 1531, with one set of N/2 phases to each of multiplexers 1530 and 1531. Additionally, multiplexers 1530 and 1531 receive clock signals 1471 as data inputs.

A previous clock signal 1031 of clock signals 1471 and current clock signal 1033 of clock signals 1471 may be respectively output from multiplexers 1530 and 1531 responsive to a selected phase of clock signals 1471. More particularly, N/2 phase for clock signals 1471 are provided to each of multiplexers 1530 and 1531. Thus, it should be understood that a clock select bus 1528, which is indicated at being an N wide bus, has two complete sets of phase select signals, a set of which is provided to multiplexer 1530 and the other set of which is provided to multiplexer 1531 as respective control select inputs. A selected phase of clock signals 1471 may be the phase asserted for selection of clock signal 1033, and a phase immediately prior to the selected phase may be the phase asserted for selection of clock signal 1031. It should be understood that after an initial phase alignment by phase alignment loop 1579, the selected phase is generally held constant. Thus, the outputs from multiplexers 1031 and 1033 are generally held constant.

Output of multiplexer 1530 is coupled to delay block 1532 and aligner logic control block 1550. Output of multiplexer 1531 is coupled to aligner logic control block 1550. Output of delay 1532 is clock edge signal 1032, and output of delay 1532 is provided as an input to aligner logic control block 1550.

In this embodiment, three phases of clocks, namely clock signals 1031 through 1033, are used, where clock signals 1031 and 1033 are selected by phase control select signals 1528. Clock signals 1031 through 1033 are generally held constant thereafter, as such three phases of clock signals 1031 through 1033 are responsive to a clock selected to be PMA clock signal 1520 which is provided as current clock 1033. Clock signals 1031 through 1033 were previously described with reference to FIG. 10.

Three phases are thus used to define a window. One of the three phases of clocks is for current clock 1033 which is used for a PMA interface of PMA interface clocks. The other two phases are for previous clock 1031 and clock edge 1032. Previous clock 1031 is one clock phase earlier than current clock 1033. Again, clock signals 1471 are all the same frequency but different phases.

Because current clock 1033 is selected as PMA clock 1520, a phase is selected among phases of clock signals 1471 which may be used as an index to select an earlier phase. In other words, viewing all phases of clock signals 1471 as a cycle or loop, a phase immediately earlier than the phase selected for clock signal 1520 may be used to select previous clock signal 1031. Lastly, a phase for clock edge signal 1032 that of previous clock signal 1031 after being delayed by a fixed delay 1532.

Using phases of clock signals 1031 through 1033, a window, previous clock, clock edge, and current clock, is created for aligner logic control block 1550. Aligner logic control block 1550 uses this window for comparing PCS clock 1475 provided to aligner logic control block 1550 with current clock 1031 in order to phase align PCS clock 1475 to current clock 1033. In other words, effectively a window created by such three phases of clocks is used for phase tracking in order to keep a PCS clock domain phase aligned with a PMA clock domain.

Aligner logic control block 1550 may be aligner logic 910 of FIG. 9. Accordingly, aligner logic control block 1550 may include a decoder 1552, phase detector 1551, optional low-pass filter 903, and anti-jitter filter 902.

With simultaneous reference to FIGS. 9 and 15, aligner logic control block 1550 is further described. In aligner logic control block 1550, phase detector 1551 is illustratively depicted, which may or may not include an interface gearbox of interface gearbox/phase detector 901. This is because in an embodiment a data link of system 1500 may only be an RX data link. However, in another embodiment, phase detector 1551 may be interface gearbox/phase detector 901 for sharing as between RX and TX data links.

Furthermore, rather than decoder/mapper block 905, decoder 1552 is illustratively depicted as decoder as a mapping function has been separated out. A code mapper 1553 for mapping code, as previously described herein, to programmable delay chain 357 is illustratively depicted. Accordingly, control signals 1355 may be provided to from decoder 1552 to code mapper 1553 for mapping to programmable delay chain 357.

Clock reference signal 360 may be output from multiplexer 359 as one of many clock sources, such as various reference clocks 358 input to multiplexer 359. Clock reference signal 360 may be the selected clock used to feed through as a clock source of delay flip-flops for a PCS to PMA interface after routing through FPGA fabric routing. Clock reference signal 360 may be byte clock signal 212, and optionally may be provided via bus 222.

Aligner logic control block 1550, code mapper 1533, and programmable delay chain 357 effectively provide a delay aligner programmable delay chain which is inserted into the clock path to adjust timing of clocks used in a PCS clock domain of data link interface of system 1500. Thus, phase adjustment loop 1580 uses aligner logic control block 1550, code mapper 1533, and programmable delay chain 357 to adjust phase of reference clock signal 360 for alignment, subject to the granularity of programmable delay chain, with current clock signal 1033. Clock signal 956 may thus be output from programmable delay chain 357, as previously described.

Control loops 1579 and 1580 may be used to maintain an RX data link of system 1500 between PCS and PMA clock domains phase aligned over PVT variation, as well as variation of incoming data phase. Again, controller adjustment loop 1579 is used for an initial alignment between clocks used in PCS and PMA clock domains, where phase of a PMA clock is aligned to phase of a PCS clock for such initial phase alignment. Phase adjustment loop 1579 compares a PCS clock signal 1475 with multiple phases of PMA clock signals 1471, and selects one phase of PMA clock signals 1471 for initial phase alignment of an RX data link interface. Accordingly, loop 1579 is activated for this initial alignment of a recovered clock and is deasserted once such alignment is obtained.

Generally, after or as an initial alignment is obtained by control loop 1579, delay alignment adjustment loop 1580 goes from being deasserted to being asserted and continues to be asserted thereafter for operation. It should be understood once PMA clock 1520 is selected, PMA clock 1520 continues to be current clock 1033, as loop 1579 is deasserted after such selection, is generally held constant. In other words, there is generally no adjusting of phase for PMA clock signal 1520 after initial alignment.

Thus programmable delay chain 357 may change phase of reference clock 360 responsive to coding 1355 to adjust phase of PCS clock 1475 to be held in a window defined by phases of clock signals 1031 through 1033. Because such window condition is defined by initial use of control loop 1579, an RX data link of system 1500 is able to maintain phase alignment with a recovered data clock. Programmable delay chain 357 thus adjusts phase of clock signal 956 for maintaining such phase alignment.

Clock signal 956 is provided to FPGA fabric routing 1410, which may be thought of as clock signal 1476 provided from RX delay aligner 1440 of FIG. 14. Thus, after delay by FPGA fabric routing 1410, clock signal 956 may be provided as a delayed version of a byte clock signal 1411 to an optional clock domains generator 391 for providing multiple phases, namely P3 phases of clock signals 1524 to FPGA fabric routing 1420, where P3 is an integer greater than one. After some delay, clock signals 1524 may be provided as multiple clock inputs 1523 to multiplexer 1522. From multiplexer 1522 a byte clock 1475 may be selected for output to phase detector/clock phase selection block 1513, latch 1515, and aligner logic control block 1550.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for clock phase alignment, comprising:
aligning an external clock to an internal clock by adjusting phase of the external clock using a first circuitry loop in a first alignment mode;
wherein the external clock is of a physical medium attachment clock domain;
wherein the internal clock is of a physical coding clock domain;
after the aligning of the external clock to the internal clock, maintaining the external clock; and
after the aligning of the external clock to the internal clock, aligning the internal clock to the external clock by adjusting phase of the internal clock using a second circuitry loop in a second alignment mode,
wherein the first circuitry loop is activated during the first alignment mode and deactivated during the second alignment mode, and wherein the second circuitry loop is activated during the second alignment mode and deactivated during the first alignment mode.

2. The method according to claim 1, wherein:
the aligning of the internal clock to the external clock includes:
determining whether the internal clock is leading or lagging with respect to the external clock;
providing phase information in response to the determining; and
programming a delay chain to add or remove delay in the internal clock responsive to the phase information to avoid having to adjust phase of the external clock.

3. The method according to claim 2, wherein:
the external clock is a transmit clock for serial transmission of data; and
the internal clock is for parallel data;
wherein the internal clock is a fraction of the frequency of the external clock.

4. The method according to claim 2, wherein:
the external clock is a recovered data clock for serial reception of data; and
the internal clock is for parallel data.

5. The method according to claim 2, further comprising:
outputting the internal clock from the delay chain phase aligned with the external clock.

6. The method according to claim 5, wherein the aligning of the internal clock to the external clock further includes:
filtering the phase information to provided filtered information;
decoding the filtered information to provide decoded information; and
selecting the decoded information to provide to the delay chain.

7. An apparatus for clock phase alignment, comprising:
a first circuitry loop configured to align a first clock signal in a physical medium attachment clock domain to a second clock signal in a physical coding clock domain by adjusting phase of the first clock signal in a first alignment mode; and
a second circuitry loop coupled to the first circuitry loop;
wherein the second circuitry loop is configured to align the second clock signal to the first clock signal by adjusting phase of the second clock signal, after the first clock signal is aligned to the second clock signal in a second alignment mode, and
wherein the first circuitry loop is activated during the first alignment mode and deactivated during the second alignment mode, and wherein the second circuitry loop is activated during the second alignment mode and deactivated during the first alignment mode.

8. The apparatus according to claim 7, wherein:
the second circuitry loop is coupled to the first circuitry loop via a delay aligner for a transmit side of a data link;
the delay aligner is coupled to receive the first clock signal and the second clock signal; and
the delay aligner is configured to determine whether the first clock signal is leading or lagging with respect to the second clock signal and is configured to generate edge alignment information responsive thereto.

9. The apparatus according to claim 8, wherein:
the delay aligner includes a phase detector, a decoder, a filter module, a mapper, and a programmable delay chain.

10. The apparatus according to claim 9, wherein:
the phase detector is coupled to receive the first clock signal and the second clock signal and is configured to provide an up/down signal;
the filter module is coupled to receive the up/down signal and is configured to accumulate up/down information obtained from the up/down signal for providing a code; and
the decoder is coupled to receive the code;
wherein the code is a form of the edge alignment information.

11. The apparatus according to claim 10, wherein:
the decoder is configured for multiple modes; and
the decoder is configured to select a mode from the multiple modes.

12. The apparatus according to claim 11, wherein:
the mode selected is from a group consisting of a decode to gray code mode, a decode to thermocode mode, and a decode to coarse and fine segments mode; and
the decoder is configured to decode the code to provide the edge alignment information; and
the mapper is coupled to receive the edge alignment information and is configured to map the edge alignment information to the programmable delay chain.

13. The apparatus according to claim 9, wherein:
the delay aligner is shared between the transmit side of the data link and a receive side of the data link; and
the delay aligner includes the phase detector for the transmit side and further includes a bang-bang detector and a majority voter for the receive side.

14. The apparatus according to claim 7, wherein:
the second circuitry loop includes a delay aligner for a receive side of a data link;
the delay aligner is coupled to receive the first clock signal and the second clock signal; and
the delay aligner is configured to determine whether the first clock signal is leading or lagging with respect to the second clock signal and is configured to generate edge alignment information responsive thereto.

15. The apparatus according to claim 14, wherein:
the delay aligner includes a bang-bang detector, a majority voter, a decoder, a filter module, a mapper, and a programmable delay chain.

16. The apparatus according to claim 15, wherein:
the bang-bang detector is coupled to receive the first clock signal, the second clock signal, a third clock signal, and a fourth clock signal;
the third clock signal is the first clock signal at an increment earlier in phase than the first clock signal;
the fourth clock signal is a delayed version of the third clock signal; and
the bang-bang detector is configured to define a window using phases of the first clock signal, the third clock signal, and the fourth clock signal for comparing with phase of the second clock signal.

17. The apparatus according to claim 16, wherein:
the bang-bang detector is configured to provide an early/late signal to the majority voter;
the majority voter having a width in which to total early bits and late bits of the early/late signal to provide a lead/lag signal;
the filter module is coupled to receive the lead/lag signal and is configured to accumulate lead/lag information obtained from the lead/lag signal for providing a code; and
the decoder is coupled to receive the code;
wherein the code is a form of the edge alignment information.

18. The apparatus according to claim 17, wherein:
the decoder is configured for multiple modes; and
the decoder is configured to select a mode from the multiple modes.

19. The apparatus according to claim 18, wherein:
the mode selected is from a group consisting of a decode to gray code mode, a decode to thermocode mode, and a decode to coarse and fine segments mode; and
the decoder is configured to decode the code to provide the edge alignment information; and
the mapper is coupled to receive the edge alignment information and is configured to map the edge alignment information to the programmable delay chain.

20. The apparatus according to claim 15, wherein:
the delay aligner is shared between a transmit side of the data link and the receive side of the data link; and
the delay aligner includes a phase detector for the transmit side and further includes a bang-bang detector and a majority voter for the receive side.

* * * * *